(12) United States Patent
Meyer

(10) Patent No.: US 8,212,139 B2
(45) Date of Patent: Jul. 3, 2012

(54) THIN-FILM PHOTOVOLTAIC MODULE

(75) Inventor: Dallas W. Meyer, Prior Lake, MN (US)

(73) Assignee: Tenksolar, Inc., Minneapolis, MN (US)

( * ) Notice: Subject to any disclaimer, the term of this patent is extended or adjusted under 35 U.S.C. 154(b) by 307 days.

(21) Appl. No.: 12/684,595

(22) Filed: Jan. 8, 2010

(65) Prior Publication Data
US 2010/0131108 A1  May 27, 2010

Related U.S. Application Data

(63) Continuation-in-part of application No. 12/357,268, filed on Jan. 21, 2009, and a continuation-in-part of application No. 12/357,260, filed on Jan. 21, 2009.

(60) Provisional application No. 61/022,240, filed on Jan. 18, 2008, provisional application No. 61/022,242, filed on Jan. 18, 2008, provisional application No. 61/022,246, filed on Jan. 18, 2008, provisional application No. 61/022,249, filed on Jan. 18, 2008, provisional application No. 61/022,252, filed on Jan. 18, 2008, provisional application No. 61/022,267, filed on Jan. 18, 2008, provisional application No. 61/035,976, filed on Mar. 12, 2008, provisional application No. 61/042,629, filed on Apr. 4, 2008.

(51) Int. Cl.
*H01L 31/0203* (2006.01)

(52) U.S. Cl. ............. 136/244; 136/251; 438/66; 438/67

(58) Field of Classification Search .......... 136/243–265; 438/57–98
See application file for complete search history.

(56) References Cited

U.S. PATENT DOCUMENTS

| | | | |
|---|---|---|---|
| 4,227,298 A | 10/1980 | Keeling | |
| 4,321,416 A | 3/1982 | Tennant | |
| 4,461,922 A * | 7/1984 | Gay et al. .................... | 136/249 |
| 4,481,378 A | 11/1984 | Lesk | |
| 4,514,579 A | 4/1985 | Hanak | |
| 4,604,494 A | 8/1986 | Shepard, Jr. | |
| 4,611,090 A | 9/1986 | Catella | |
| 4,617,421 A | 10/1986 | Nath | |
| 4,695,788 A | 9/1987 | Marshall | |
| 4,773,944 A | 9/1988 | Nath | |

(Continued)

FOREIGN PATENT DOCUMENTS

JP  09-045946 A  2/1997

(Continued)

OTHER PUBLICATIONS

U.S. Appl. No. 12/357,260, filed Jan. 21, 2009, Meyer.

(Continued)

*Primary Examiner* — Basia Ridley
*Assistant Examiner* — Christina Chern
(74) *Attorney, Agent, or Firm* — Maschoff Gilmore & Israelsen

(57) ABSTRACT

In some embodiments, a photovoltaic module includes an active layer, a top layer, and a bottom layer. The active layer includes a plurality of strips of thin-film PV material that are arranged spaced apart from and substantially parallel to each other. The top layer is disposed above the active layer and includes a substantially transparent film. The bottom layer is disposed below the active layer, the bottom layer including a conductive backsheet configured to form a current return path for the strips of thin-film PV material. The PV module further includes means for serially and redundantly interconnecting the strips of thin-film PV material together.

21 Claims, 28 Drawing Sheets

U.S. PATENT DOCUMENTS

| | | |
|---|---|---|
| 4,854,974 A | 8/1989 | Carlson |
| 4,933,022 A | 6/1990 | Swanson |
| 4,966,631 A | 10/1990 | Matlin |
| 5,021,099 A | 6/1991 | Kim |
| 5,205,739 A | 4/1993 | Malo |
| 5,246,782 A | 9/1993 | Kennedy |
| 5,268,037 A | 12/1993 | Glatfelter |
| 5,270,636 A | 12/1993 | Lafferty |
| 5,288,337 A | 2/1994 | Mitchell |
| 5,457,057 A | 10/1995 | Nath |
| 5,468,988 A | 11/1995 | Glatfelter |
| 5,478,402 A | 12/1995 | Hanoka |
| 5,493,096 A | 2/1996 | Koh |
| 5,513,075 A | 4/1996 | Capper |
| 5,571,338 A | 11/1996 | Kadonome |
| 5,593,901 A | 1/1997 | Oswald |
| 5,719,758 A | 2/1998 | Nakata |
| 5,735,966 A | 4/1998 | Luch |
| 5,801,519 A | 9/1998 | Midya |
| 5,896,281 A | 4/1999 | Bingley |
| 5,910,738 A | 6/1999 | Shinohe |
| 5,982,157 A | 11/1999 | Wattenhoffer |
| 5,990,413 A | 11/1999 | Ortabasi |
| 5,994,641 A | 11/1999 | Kardauskas |
| 6,011,215 A | 1/2000 | Glatfelter |
| 6,077,722 A | 6/2000 | Jansen |
| 6,111,189 A | 8/2000 | Garvison |
| 6,111,454 A | 8/2000 | Shinohe |
| 6,111,767 A | 8/2000 | Handleman |
| 6,201,180 B1 | 3/2001 | Meyer |
| 6,288,325 B1 | 9/2001 | Jansen |
| 6,294,723 B2 | 9/2001 | Uematsu |
| 6,331,208 B1 | 12/2001 | Nishida |
| 6,339,538 B1 | 1/2002 | Handleman |
| 6,351,130 B1 | 2/2002 | Preiser |
| 6,465,724 B1 | 10/2002 | Garvison |
| 6,515,215 B1 | 2/2003 | Mimura |
| 6,528,716 B2 | 3/2003 | Collette |
| 6,706,963 B2 | 3/2004 | Gaudiana |
| 6,739,692 B2 | 5/2004 | Unosawa |
| 6,750,391 B2 | 6/2004 | Bower |
| 6,753,692 B2 | 6/2004 | Toyomura |
| 6,803,513 B2 | 10/2004 | Beernink |
| 6,858,461 B2 | 2/2005 | Oswald |
| 6,870,087 B1 | 3/2005 | Gallagher |
| 6,882,063 B2 | 4/2005 | Droppo |
| 6,966,184 B2 | 11/2005 | Toyomura |
| 6,992,256 B1 | 1/2006 | Wiley |
| 7,009,412 B2 | 3/2006 | Chong |
| 7,094,441 B2 | 8/2006 | Chittibabu |
| 7,138,730 B2 | 11/2006 | Lai |
| 7,259,322 B2 | 8/2007 | Gronet |
| 7,276,724 B2 | 10/2007 | Sheats |
| 7,336,004 B2 | 2/2008 | Lai |
| 7,339,108 B2 | 3/2008 | Tur |
| 7,342,171 B2 | 3/2008 | Khouri |
| 2003/0121228 A1 | 7/2003 | Stoehr |
| 2004/0261834 A1 | 12/2004 | Basore |
| 2005/0022857 A1 | 2/2005 | Daroczi |
| 2005/0115176 A1 | 6/2005 | Russell |
| 2005/0133081 A1 | 6/2005 | Amato |
| 2005/0158891 A1 | 7/2005 | Barth |
| 2005/0172995 A1 | 8/2005 | Rohrig |
| 2005/0194939 A1 | 9/2005 | Duff, Jr. |
| 2005/0263179 A1 | 12/2005 | Guadiana |
| 2005/0268959 A1 | 12/2005 | Aschenbrenner |
| 2005/0278076 A1 | 12/2005 | Barbir |
| 2006/0001406 A1 | 1/2006 | Matan |
| 2006/0042681 A1 | 3/2006 | Korman |
| 2006/0162772 A1 | 7/2006 | Presher, Jr. |
| 2006/0180197 A1 | 8/2006 | Gui |
| 2006/0185716 A1 | 8/2006 | Murozono |
| 2006/0213548 A1 | 9/2006 | Bachrach |
| 2006/0235717 A1 | 10/2006 | Sharma |
| 2006/0261830 A1 | 11/2006 | Taylor |
| 2006/0266407 A1 | 11/2006 | Lichey |
| 2007/0056626 A1 | 3/2007 | Funcell |
| 2007/0079861 A1 | 4/2007 | Morali |
| 2007/0095384 A1 | 5/2007 | Farquhar |
| 2007/0103108 A1 | 5/2007 | Capp |
| 2007/0113885 A1 | 5/2007 | Chan |
| 2007/0124619 A1 | 5/2007 | Mizukami |
| 2007/0125415 A1 | 6/2007 | Sachs |
| 2007/0157964 A1 | 7/2007 | Gronet |
| 2007/0186971 A1 | 8/2007 | Lochun |
| 2007/0235077 A1 | 10/2007 | Nagata |
| 2007/0240755 A1 | 10/2007 | Lichy |
| 2007/0261731 A1 | 11/2007 | Abe |
| 2007/0266672 A1 | 11/2007 | Bateman |
| 2007/0273338 A1 | 11/2007 | West |
| 2007/0295381 A1 | 12/2007 | Fujii |
| 2008/0029152 A1 | 2/2008 | Milshtein |
| 2008/0210286 A1 | 9/2008 | Ball |
| 2009/0250093 A1 | 10/2009 | Chen |

FOREIGN PATENT DOCUMENTS

| | | |
|---|---|---|
| JP | 10-281562 | 10/1998 |
| JP | 11-041832 | 2/1999 |
| JP | 11-103538 | 4/1999 |
| JP | 2001-268891 | 9/2001 |
| JP | 2002-305318 | 10/2002 |
| JP | 2003-026455 | 1/2003 |
| KR | 10-1998-087002 | 12/1998 |

OTHER PUBLICATIONS

U.S. Appl. No. 12/357,268, filed Jan. 21, 2009, Meyer.
International Search Report and Written Opinion dated Sep. 29, 2009 as issued in International Application No. PCT/US2009/031597, filed Jan. 21, 2009.
International Search Report and Written Opinion dated Aug. 31, 2011 as received in PCT International Application No. PCT/US2010/061864.

* cited by examiner

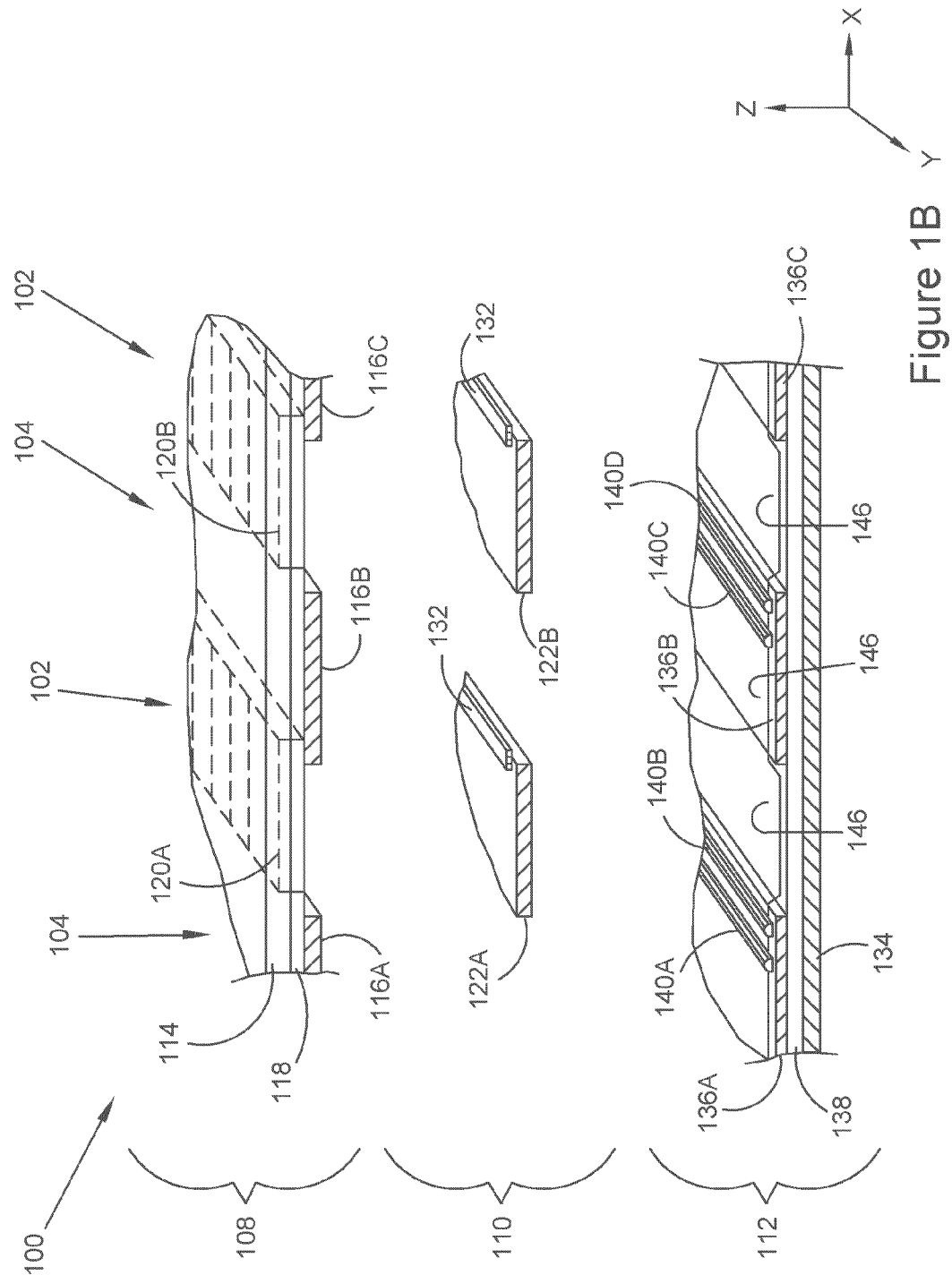

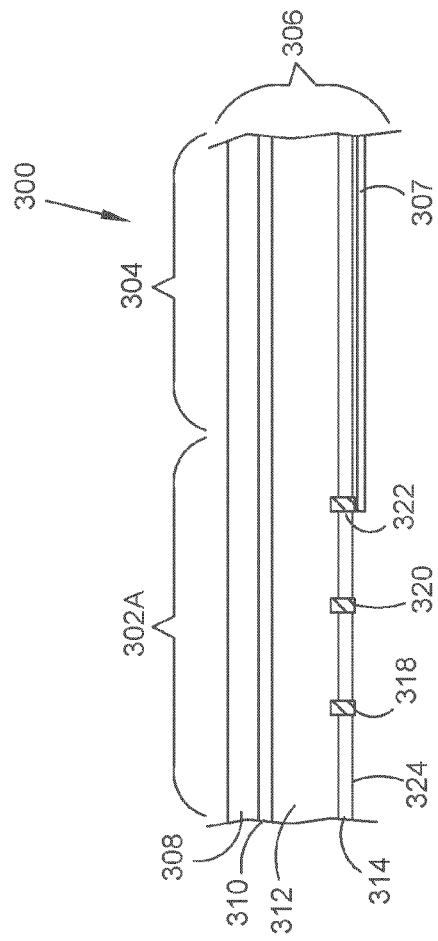
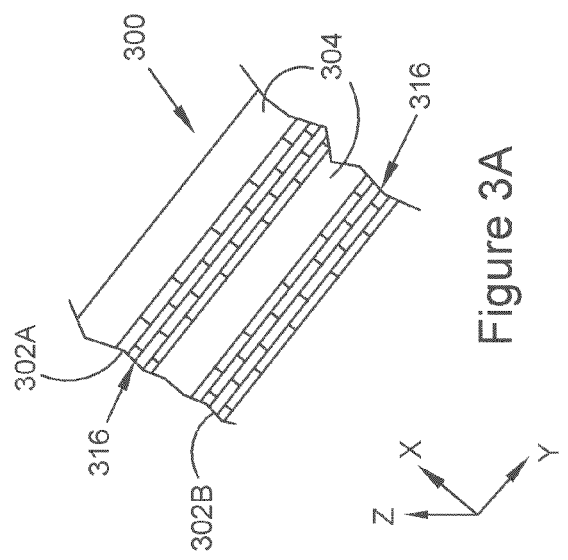
Figure 3B
Figure 3A

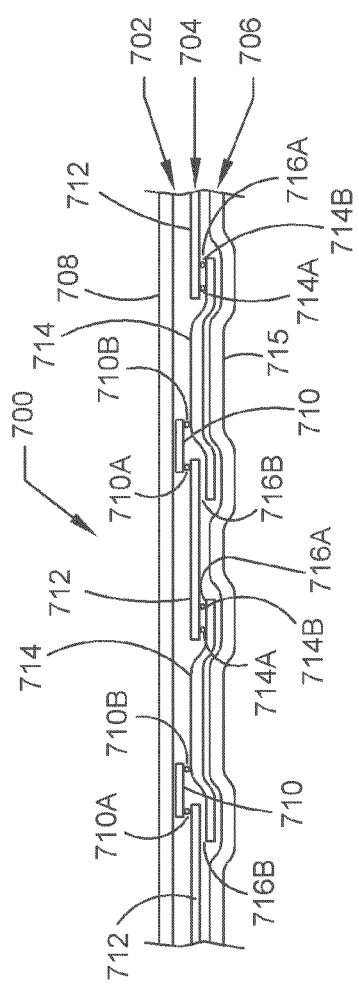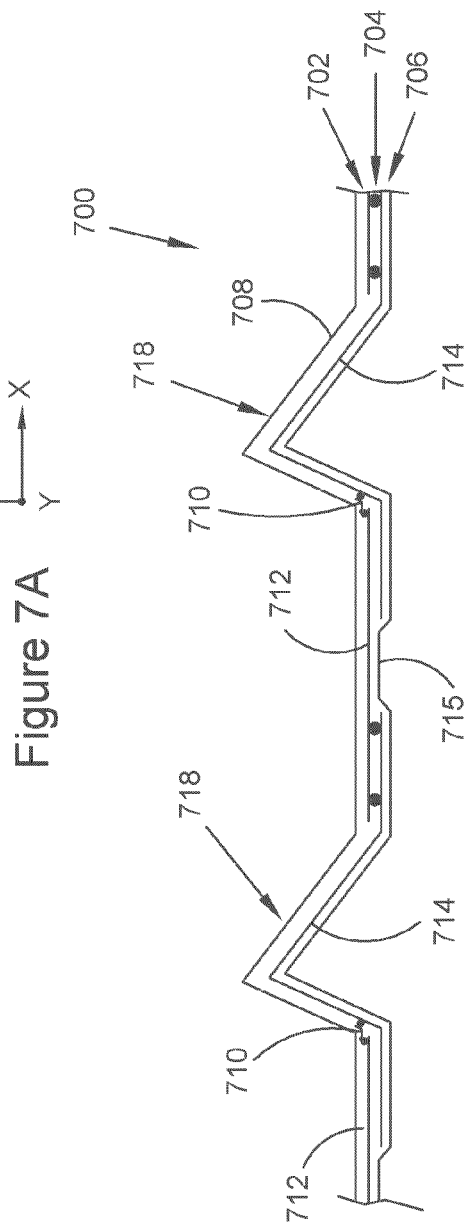
Figure 7A
Figure 7B

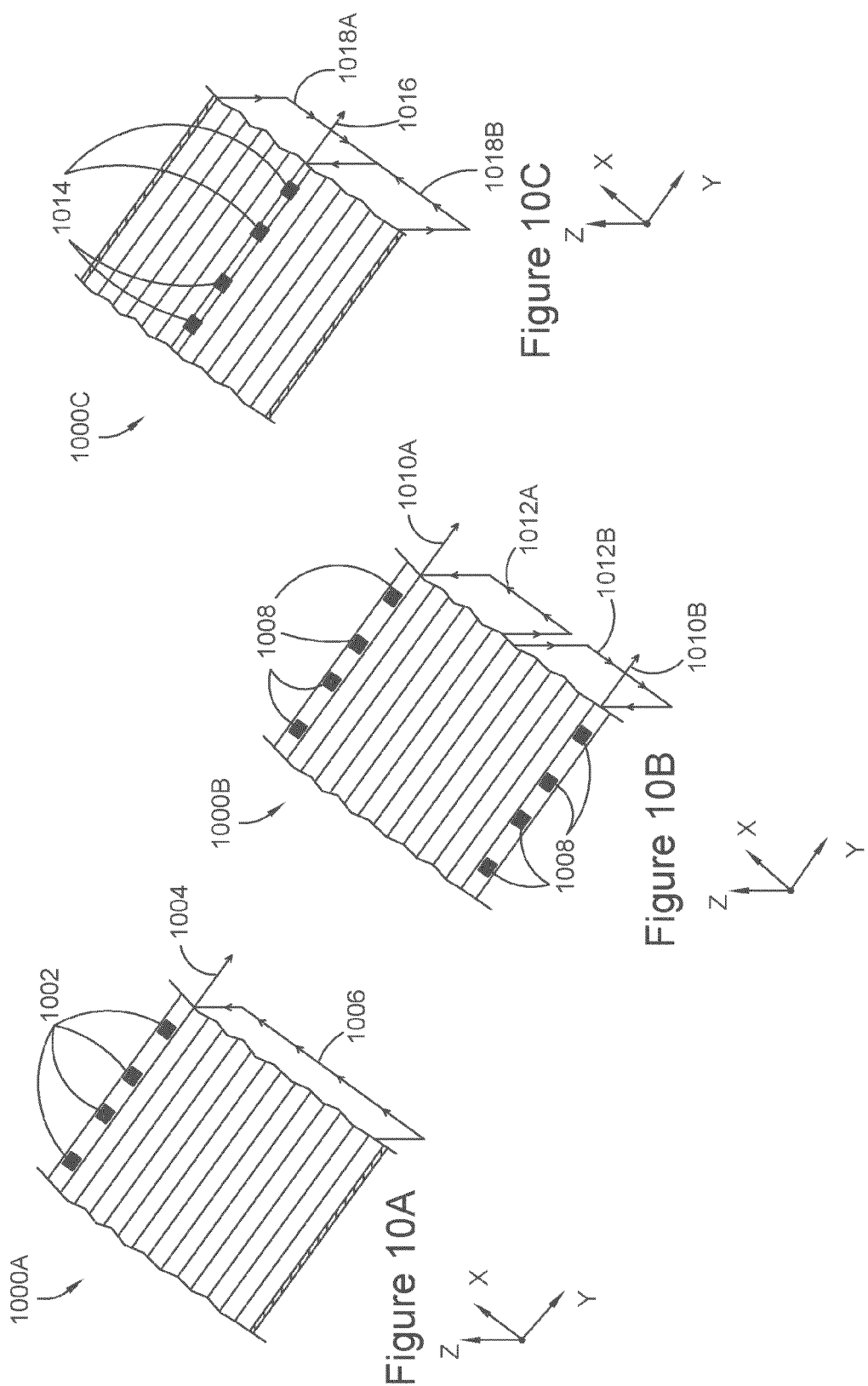

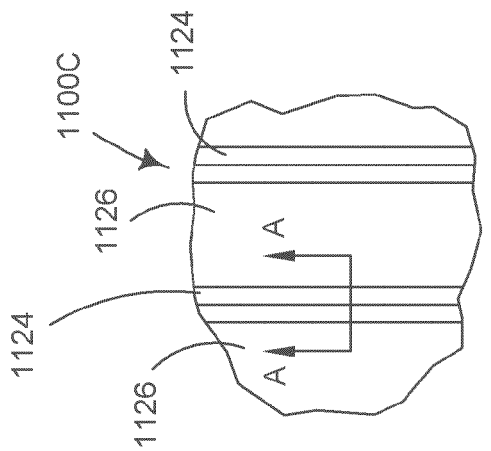
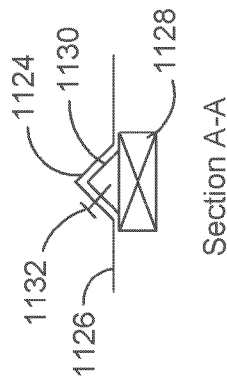
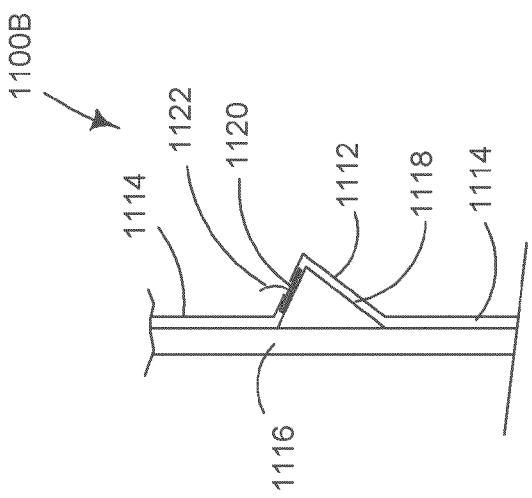
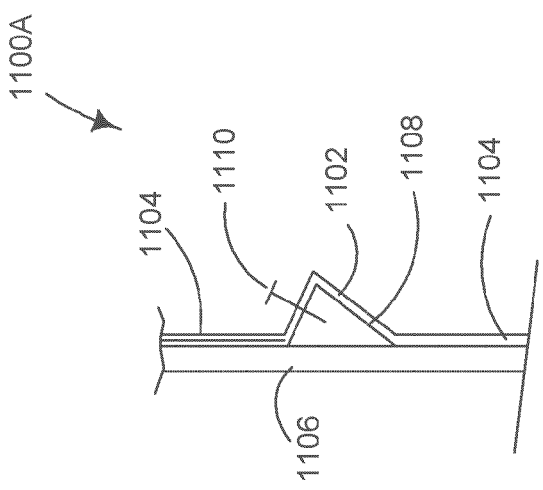

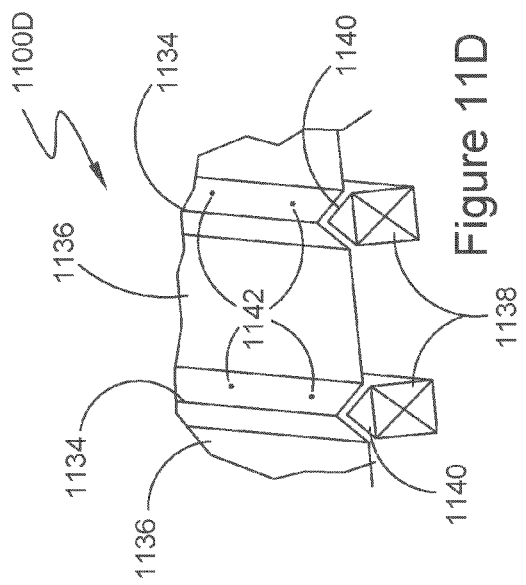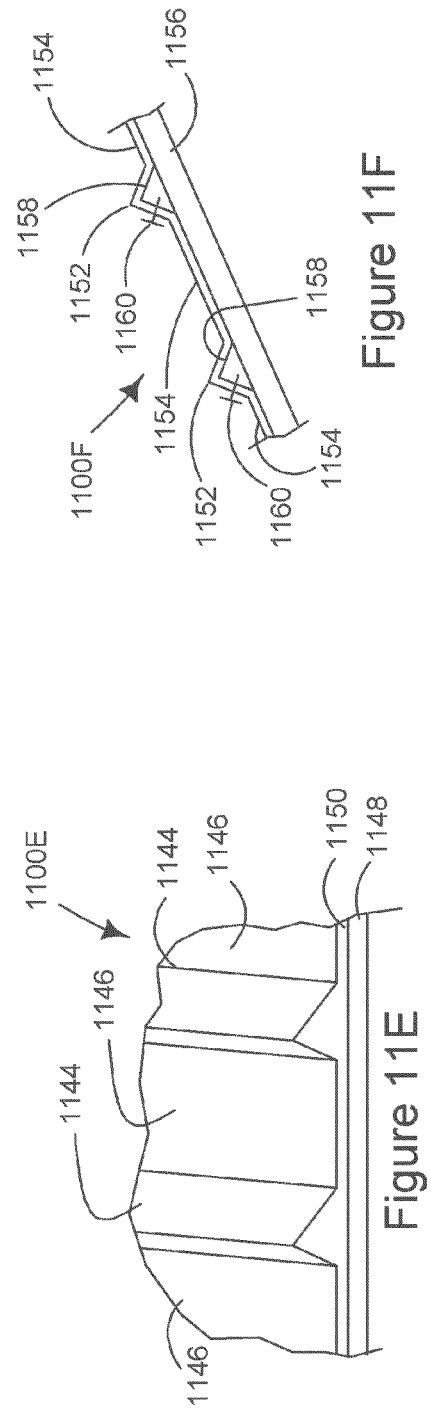

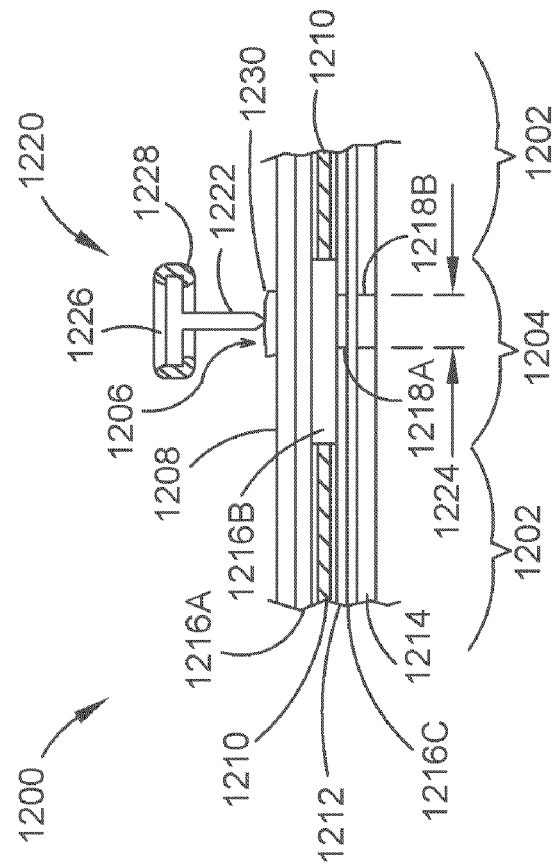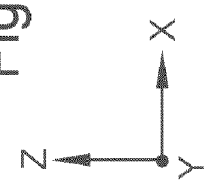
Figure 12B
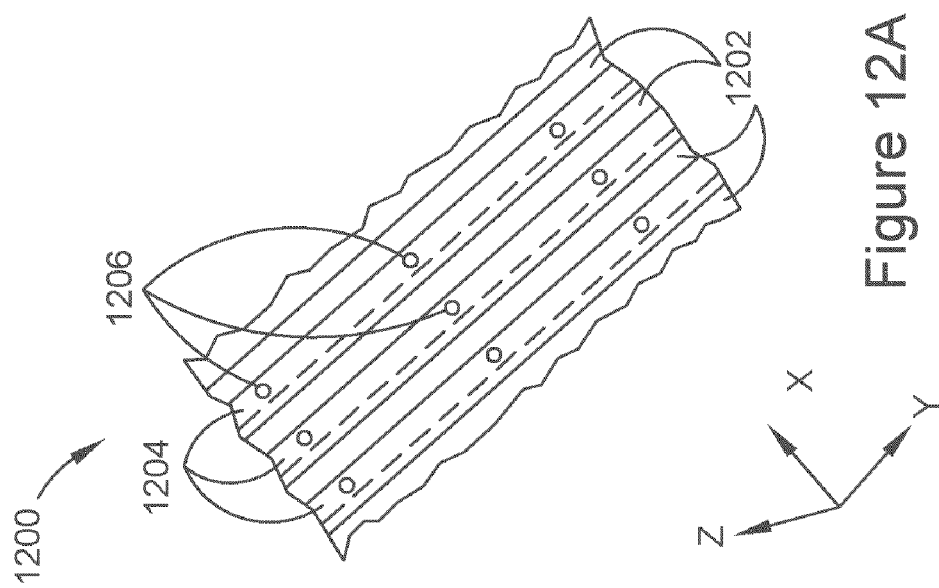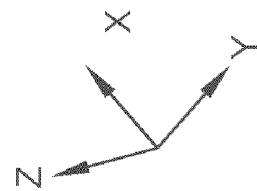
Figure 12A

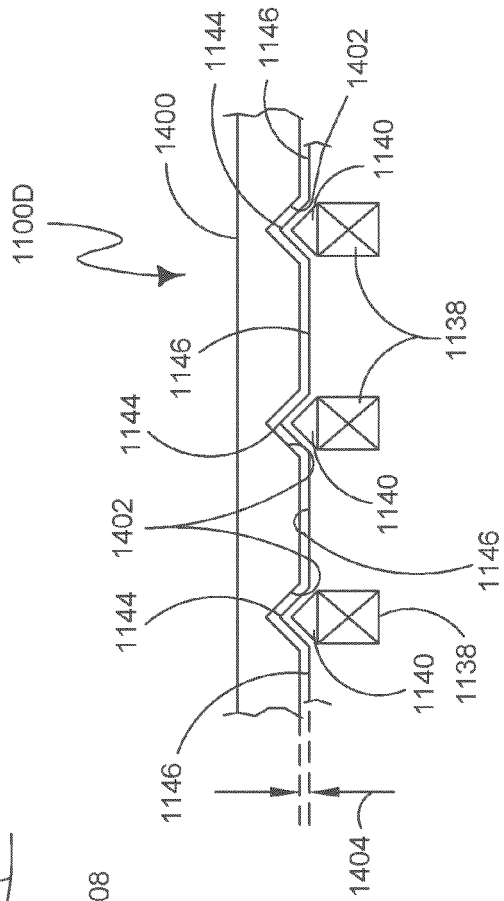
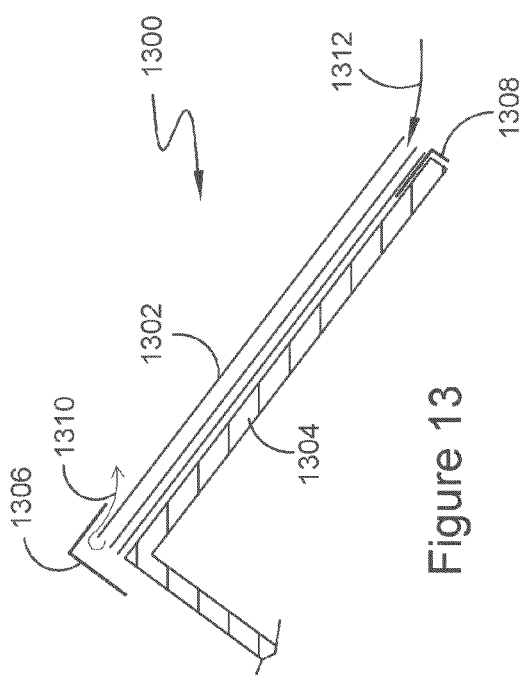
Figure 14
Figure 13

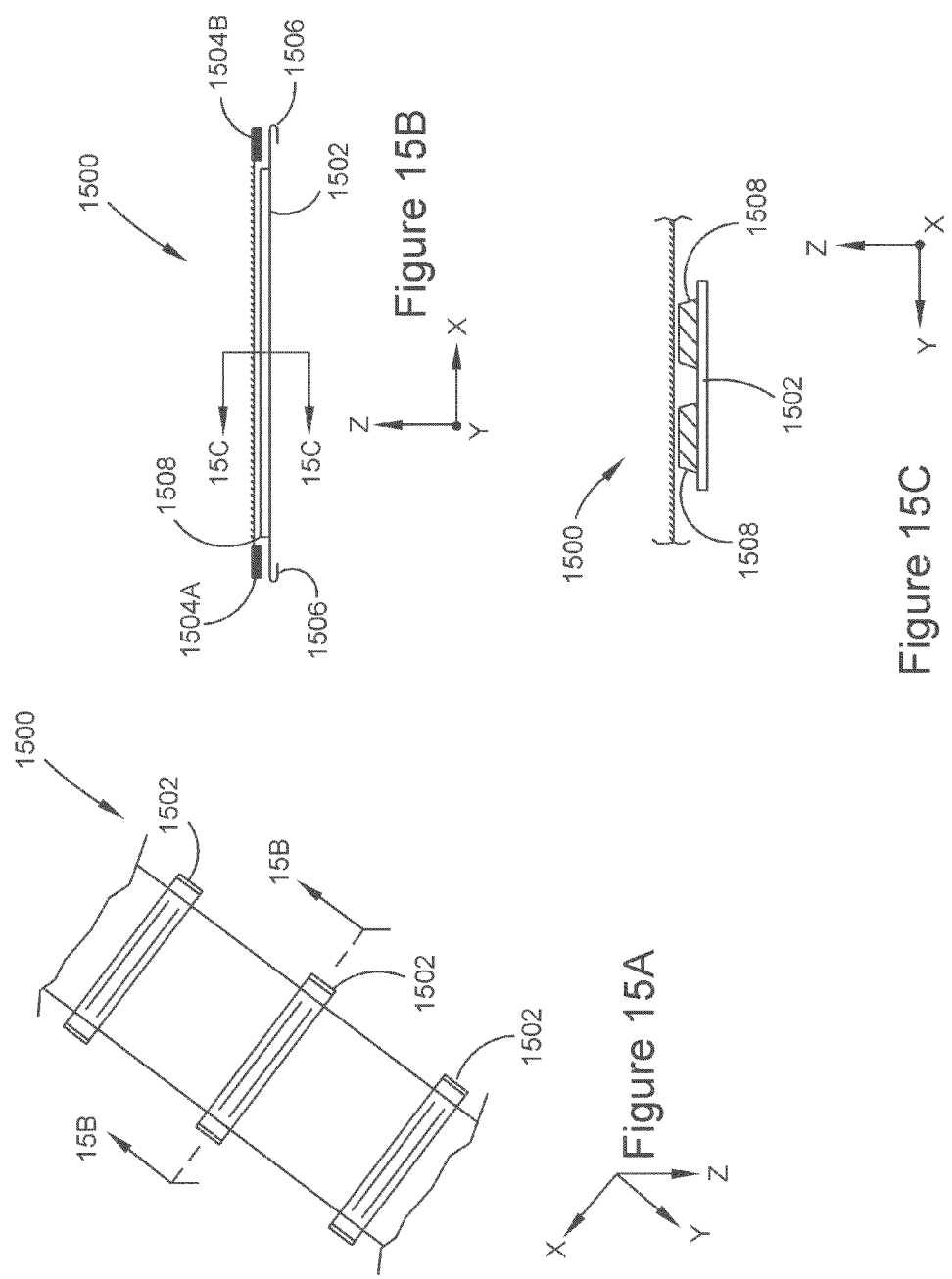

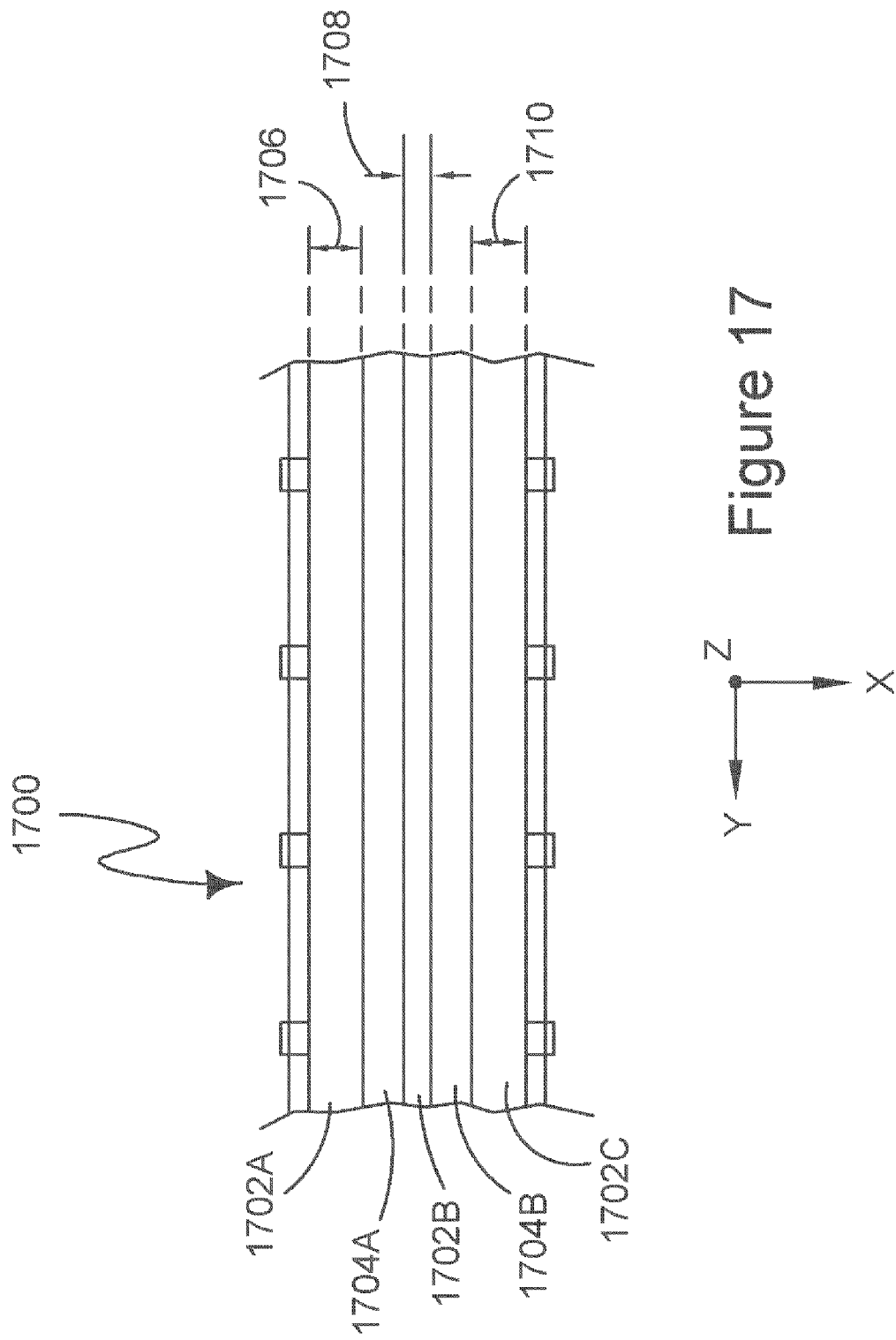

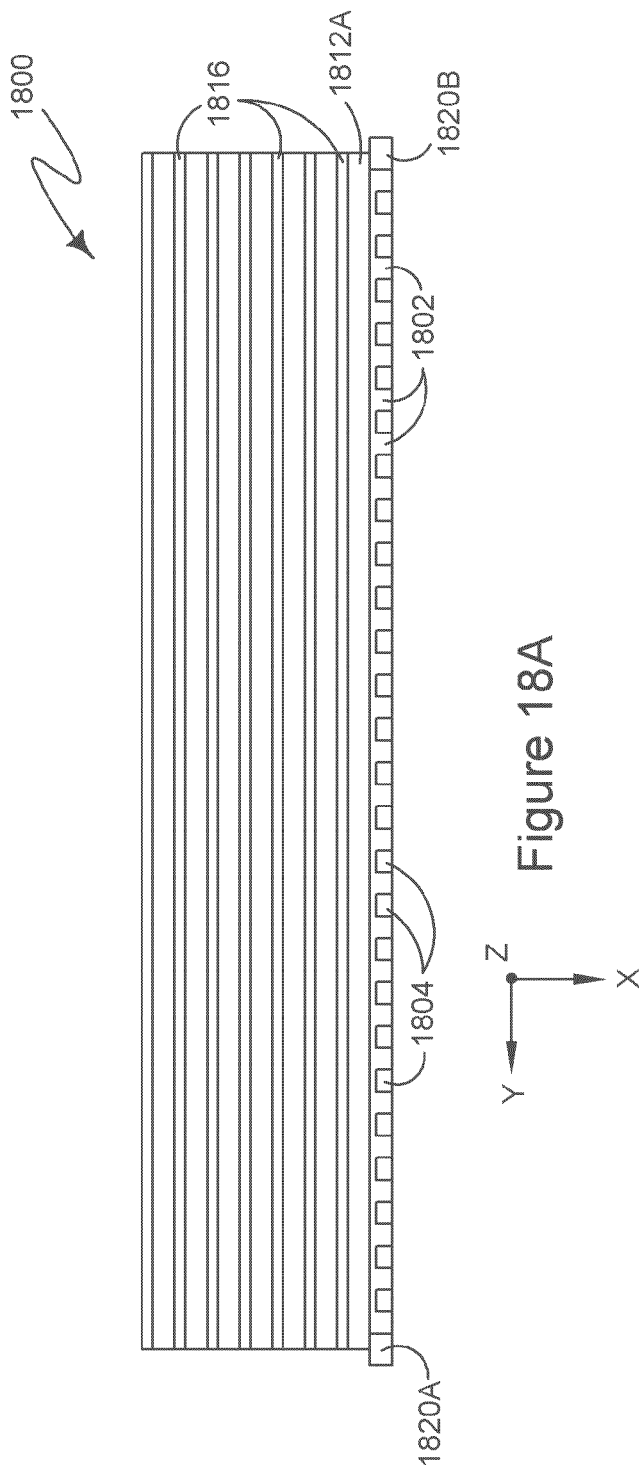
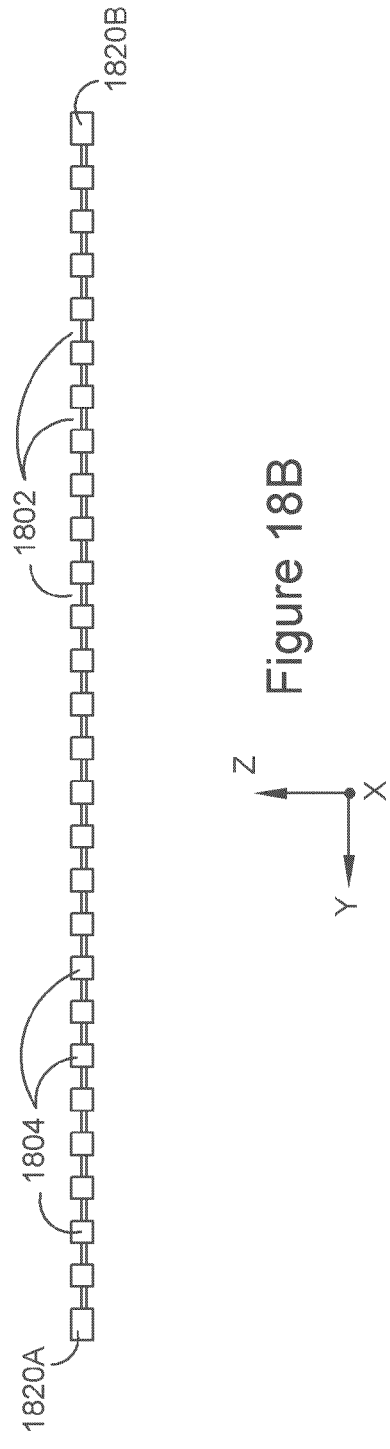
Figure 18A
Figure 18B

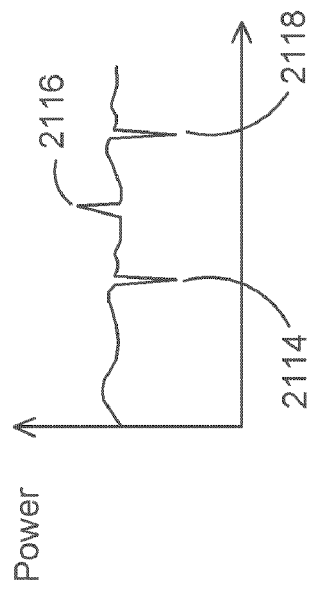
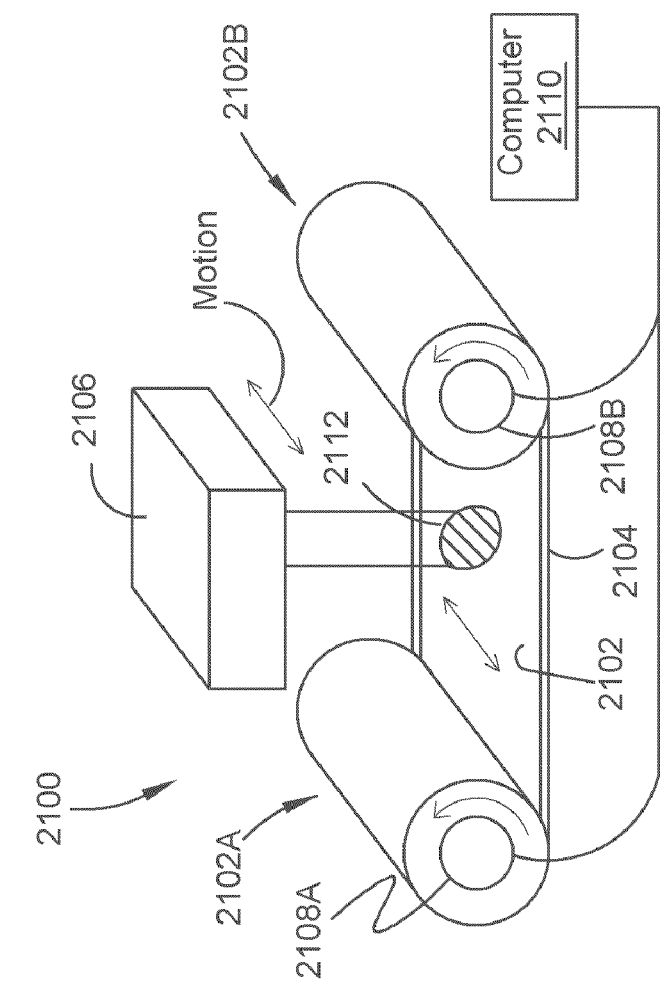
Figure 21B
Figure 21A

THIN-FILM PHOTOVOLTAIC MODULE

CROSS-REFERENCE TO RELATED APPLICATIONS

This patent application is a continuation-in-part of U.S. application Ser. No. 12/357,268, filed on Jan. 21, 2009 and entitled FLAT-PLATE PHOTOVOLTAIC MODULE, which is herein incorporated by reference in its entirety. The application Ser. No. 12/357,268 claims the benefit of priority from:

(i) U.S. Provisional Application Ser. No. 61/022,240, filed on Jan. 18, 2008 and entitled INTEGRATED DEFECT MANAGEMENT FOR A THIN-FILM PHOTOVOLTAIC SYSTEM;

(ii) U.S. Provisional Application Ser. No. 61/022,242, filed on Jan. 18, 2008 and entitled OPERATING FEATURES FOR INTEGRATED PHOTOVOLTAIC SYSTEMS, which application is herein incorporated by reference in its entirety;

(iii) U.S. Provisional Application Ser. No. 61/022,246, filed on Jan. 18, 2008 and entitled A LONGITUDINALLY CONTINUOUS PHOTOVOLTAIC MODULE, which application is herein incorporated by reference in its entirety;

(iv) U.S. Provisional Application Ser. No. 61/022,249, filed on Jan. 18, 2008 and entitled CORRUGATED PHOTOVOLTAIC PANELS, which application is herein incorporated by reference in its entirety;

(v) U.S. Provisional Application Ser. No. 61/022,252, filed on Jan. 18, 2008 and entitled A MULTI-USE GROUND BASED PHOTOVOLTAIC SYSTEM, which application is herein incorporated by reference in its entirety;

(vi) U.S. Provisional Application Ser. No. 61/022,267, filed on Jan. 18, 2008 and entitled A PHOTOVOLTAIC SYSTEM WITH EMBEDDED ELECTRONICS, which application is herein incorporated by reference in its entirety;

(vii) U.S. Provisional Application Ser. No. 61/035,976, filed on Mar. 12, 2008 and entitled A REDUNDANT SILICON SOLAR ARRAY, which application is herein incorporated by reference in its entirety; and (viii) U.S. Provisional Application Ser. No. 61/042,629, filed on Apr. 4, 2008 and entitled REDUNDANT ARRAY OF SOLAR, which application is herein incorporated by reference in its entirety.

This patent application is also a continuation-in-part of U.S. application Ser. No. 12/357,260, filed on Jan. 21, 2009 and entitled REDUNDANT ELECTRICAL ARCHITECTURE FOR PHOTOVOLTAIC MODULES, which application is herein incorporated by reference in its entirety.

BACKGROUND

1. Field of the Invention

The present invention relates generally to photovoltaic ("PV") modules. More particularly, some example embodiments relate to PV modules made from thin-film PV materials.

2. Related Technology

There are two main types of solar collectors, including silicon and thin films, commonly used in PV modules, the solar collectors commonly composed of PV cells. Silicon is currently the predominant technology, and can generally be implemented as monocrystalline or polycrystalline cells encapsulated behind a transparent glass front plate. Thin-film technology is not as wide-spread as the silicon technology due to its reduced efficiency, but it is gaining in popularity due to its lower cost.

Thin-film materials include amorphous, tandem or other silicon based thin-film materials, as well as copper indium gallium selenide ("CIGS"), copper indium gallium sulfur-selenide ("CIGSS"), and other materials. Thin-film materials can be produced in manufacturing quantities on glass substrates, metal substrates, or plastic films. Yields and efficiencies vary by technology, manufacturer, and substrate choice.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF SOME EXAMPLE EMBODIMENTS

In general, example embodiments of the invention relate to PV modules made from thin-film PV materials.

In one example embodiment, a PV module includes an active layer, a top layer, and a bottom layer. The active layer includes a plurality of strips of thin-film PV material that are arranged spaced apart from and substantially parallel to each other. The top layer is disposed above the active layer and includes a substantially transparent film. The bottom layer is disposed below the active layer, the bottom layer including a conductive backsheet configured to form a current return path for the strips of thin-film PV material. The PV module further includes means for serially and redundantly interconnecting the strips of thin-film PV material together.

In another example embodiment, a method of forming a longitudinally continuous PV module includes arranging a plurality of strips of thin-film PV material to be spaced apart from and substantially parallel to each other. A bottom layer is laminated to a first surface of the plurality of strips of thin-film PV material, the bottom layer including a plurality of bottom layer conductive strips. A top layer is laminated to a second surface of the plurality of strips of thin-film PV material, the top layer including a plurality of top layer conductive strips. The lamination of the bottom layer to the first surface and the top layer to the second surface includes serially and redundantly interconnecting the plurality of strips of thin-film PV material together by connecting each one of the strips of thin-film PV material to a different one of the plurality of bottom layer conductive strips and a different one of the plurality of top layer conductive strips.

In yet another example embodiment, a computer-readable storage medium has computer-executable instructions stored thereon that, if executed by a computing device, cause the computing device to perform a method. The method includes receiving data indicating an installation angle for a PV module at an installation site, the PV module including a plurality of plastically deformable reflector regions and a plurality of longitudinally continuous strips of thin-film photovoltaic material. Data indicating a direction the installation site faces, a latitude of the installation site and elastic and visco-elastic bend relaxation parameters for the PV module is received. A shape for the plurality of plastically deformable reflector regions is determined based on the received data.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 1A-1D disclose aspects of an example flat PV module including flat interconnecting regions and PV regions of PV strips;

FIGS. 3A-3B illustrate a first example top layer that may be implemented in the PV modules according to some embodiments;

FIGS. 7A-7B illustrate an example PV module that implements bottom layer conductive strips and gimbal strips without top layer conductive strips to serially and redundantly interconnect PV strips;

FIGS. 10A-10C disclose various PV modules electronics configurations;

FIGS. 11A-11F disclose various PV module mounting configurations;

FIGS. 12A-12B illustrate an example PV module with built-in fastener regions;

FIG. 13 illustrates a roof-mounted PV module that implements passive cooling;

FIG. 14 depicts a support device that can be implemented to support loads on a PV module;

FIGS. 15A-15C depict a PV module implementing discrete straps to support cross-directional loads on the PV module;

FIG. 17 illustrates a PV module having PV strips of unequal width;

FIGS. 18A-18D disclose aspects of PV module having clip-on power conversion circuits;

FIGS. 21A-21B disclose a system for performing product testing on a sheet of PV module material formed according to the methods of FIGS. 19A and 19B.

DETAILED DESCRIPTION OF THE PREFERRED EMBODIMENTS

Example embodiments generally relate to longitudinally continuous PV modules including an active layer having a plurality of longitudinally continuous PV strips, a flexible top layer disposed above the active layer, and a flexible bottom layer disposed below the active layer. Although not required in all embodiments, such PV modules can include a plurality of conductive strips interposed between the PV strips that at least partially serially and redundantly interconnect the PV strips. Some example embodiments take advantage of continuous roll-to-roll manufacturing methods and material efficiencies of thin-film PV materials.

I. Example PV Module

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1A:
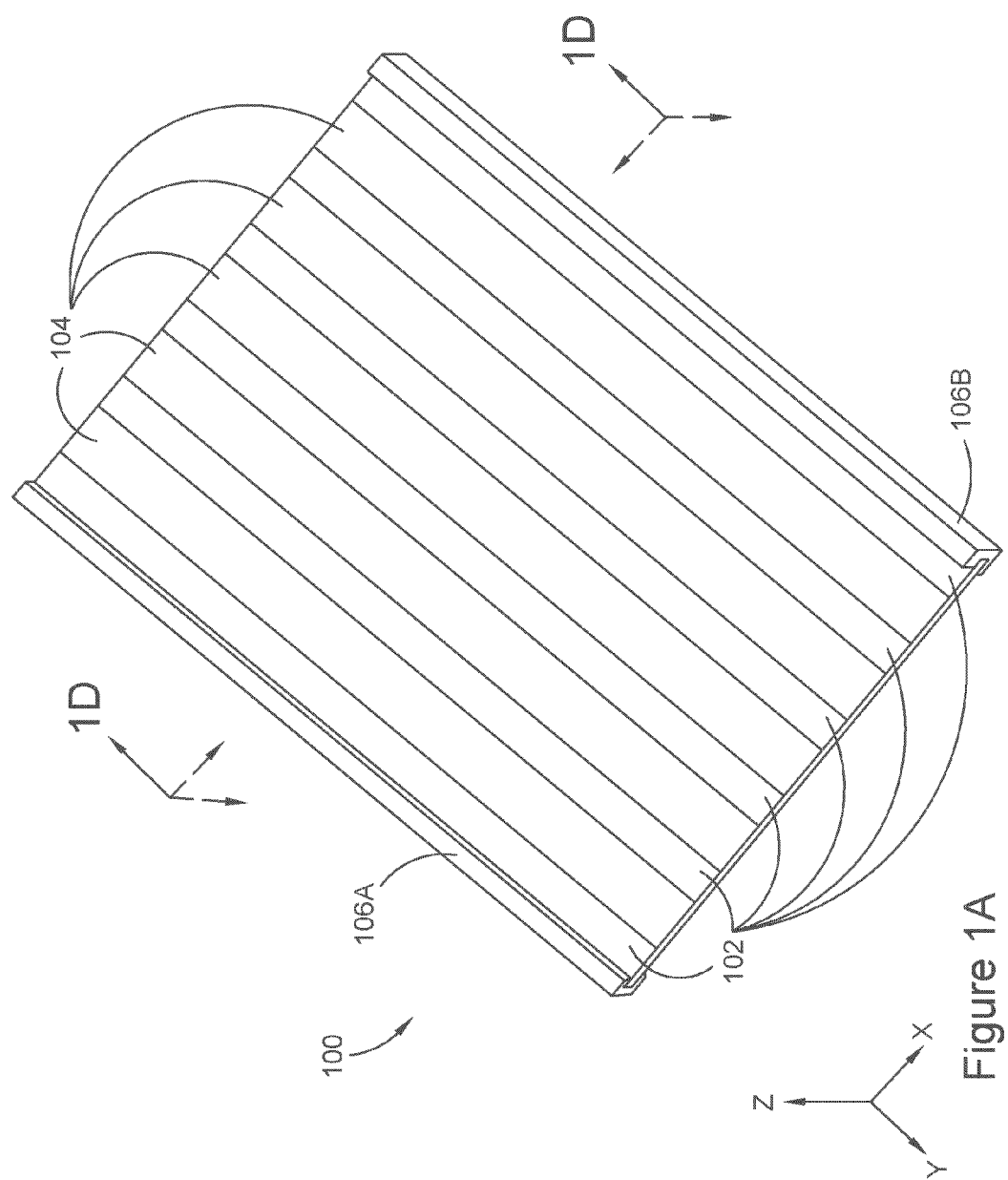

Turning first to FIG. 1A, a first example PV module 100 is disclosed according to some embodiments. FIG. 1A depicts an perspective view of the PV module 100. As shown in FIG. 1A, the PV module 100 includes a plurality of active regions 102, a plurality of interconnecting regions 104, and lengthwise edge caps 106A, 106B (collectively "edge caps 106"). The active regions 102 generally include PV material configured to convert solar energy into electricity by the photovoltaic effect.

The interconnecting regions 104 are configured to serially and redundantly interconnect the active regions 102 together. In some embodiments, the interconnecting regions 104 and active regions 104 at least partially overlap each other in the arbitrarily defined x-direction. Further, although the interconnecting regions 104 are depicted in FIG. 1A as being wider in the x-direction than the active regions 102, in other embodiments the interconnecting regions 104 are narrower in the x-direction than the active regions 102. Alternately or additionally, some embodiments include PV modules 100 with interconnecting regions 104 that are infinitesimally narrow in the x-direction, at least at the positive z surface of the PV module 100, such that the positive z surface of the PV module 100 is made up substantially entirely of active regions 104.

FIG. 1B depicts an exploded perspective view of a portion of the PV module 100. As shown in FIG. 1B, the PV module 100 includes active regions 102 and interconnecting regions 104. Further, the PV module 100 generally includes a top layer 108, an active layer 110, and a bottom layer 112.

In some embodiments, the top layer 108 includes a substantially transparent film 114 and a plurality of top layer conductive strips 116A-116C (collectively "top layer conductive strips 116") that are laminated or otherwise secured to a bottom surface of the top layer 108. In the illustrated embodiment, a top adhesive layer 118 secures the top layer conductive strips 116 to the bottom surface of the top layer 108. Alternately or additionally, a power collection grid including one or more regions 120A, 120B (collectively "power collection grid 120") is formed on a bottom surface of the substantially transparent film 114. In some embodiments, the top layer conductive strips 116 provide mechanical stiffness to the PV module 100 and/or reduce the percentage of PV material in the PV module 100. Optionally, the top layer conductive strips 116 are formed into concentrators to reflect and concentrate light onto the areas of PV material, for example.

The active layer 110 includes a plurality of strips of PV material 122A-122B (collectively "PV strips 122") that are longitudinally continuous and substantially flexible in some embodiments. As used herein, the term "longitudinally continuous" as applied to the PV strips 122 means that the PV strips 122 are continuous along the length, e.g., in the arbitrarily-defined y-direction, of the PV strips 122, as opposed to being divided into multiple discrete solar cells.

The manufacturing process of the PV module 100 in some embodiments involves manufacturing a longitudinally continuous sheet having multiple layers such as those depicted in FIG. 1B all laminated together. The longitudinally continuous sheet may be up to 2000 feet or more in length, e.g., in the y-direction, and rolled up for ease of shipment. Alternately or additionally, the longitudinally continuous sheet may be sectioned into intermediate-sized sections and shipped in smaller rolls or stacked one on top of another. Alternately or additionally, the longitudinally continuous sheet or the intermediate-sized sheets may be sectioned into finished lengths appropriate for installation before being shipped and/or at the installation site.

In some embodiments, the length in the y-direction of a finished PV module 100 suitable for installation is in a range from 20 feet to 40 feet, or even less than 20 feet or greater than 40 feet. Alternately or additionally, the aspect ratio of a finished PV module 100 is in a range from 6 to 50, or even less than 6 or greater than 50. Alternately or additionally, the width (e.g., in the x-direction) of the PV module 100 is in a range from 1 foot to 4 feet, or even less than 1 foot or greater than 4 feet.

According to some embodiments, each of PV strips 122 is between 0.5 inches and 6 inches wide as measured in the x-direction. In other embodiments, PV strips 122 are less than 0.5 inches wide or greater than 6 inches wide. Alternately or additionally, each PV module 100 includes anywhere from 10 to 40 PV strips 122. In other embodiments, each PV module 100 includes fewer than 10 PV strips 122 or more than 40 PV strips 122.

Figure 1C:
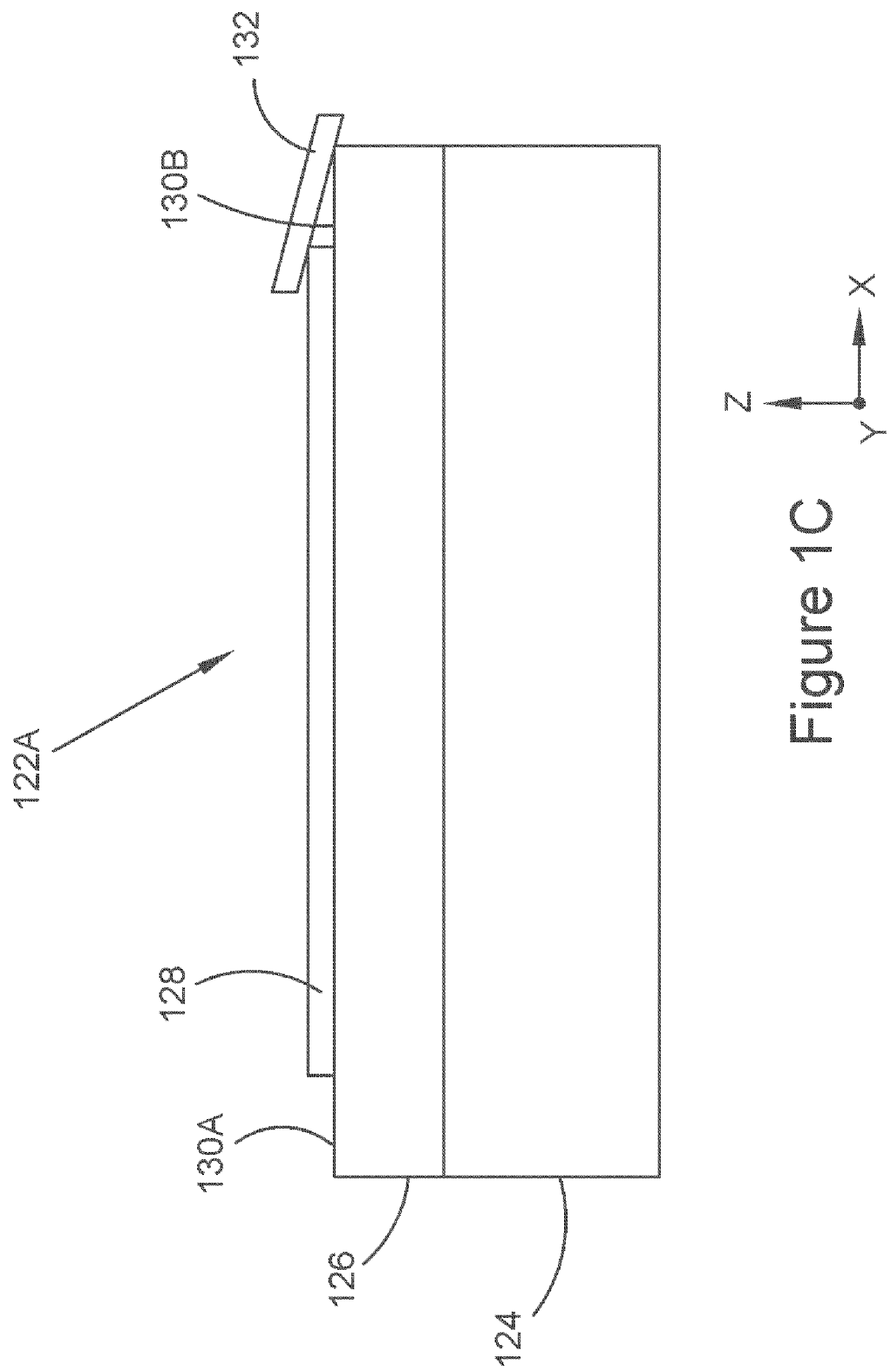

In some embodiments, the PV strip 122A is a thin-film PV material such as copper indium gallium selenide ("CIGS"), amorphous silicon ("a-Si"), or the like or any combination thereof. FIG. 1C is a cross-sectional view of the PV strip 122A according to some embodiments in which the PV strip 122A is a thin-film PV material. The other PV strips 122 of PV module 100 may be similarly configured to PV strip 122A. As shown in FIG. 1C, the PV strip 122A includes a substrate 124, a thin-film active layer 126 and a transparent conducting oxide ("TCO") 128. The PV strips 122A-122B included in the PV module 100 and other PV modules according to some embodiments can be manufactured using any method(s) and/or material(s) now known or later developed.

Optionally, the PV strip 122A further includes one or more TCO-free regions 130A, 130B (collectively "regions 130") and one or more isolation strips 132. In some embodiments, the regions 130 are processing artifacts resulting from the formation of multiple PV strips 122 from a continuous sheet of thin-film PV material. In particular, in some examples, the TCO 128 is ablated from the continuous sheet of thin-film PV material in regions 130 prior to cutting the continuous sheet of thin-film PV material into PV strips 122. The ablation of the TCO 128 from regions 130 is configured to substantially prevent the shorting of the TCO 128 to the substrate 124 when the continuous sheet of thin-film PV material is cut into PV strips 122 in some examples.

Figure 1D:
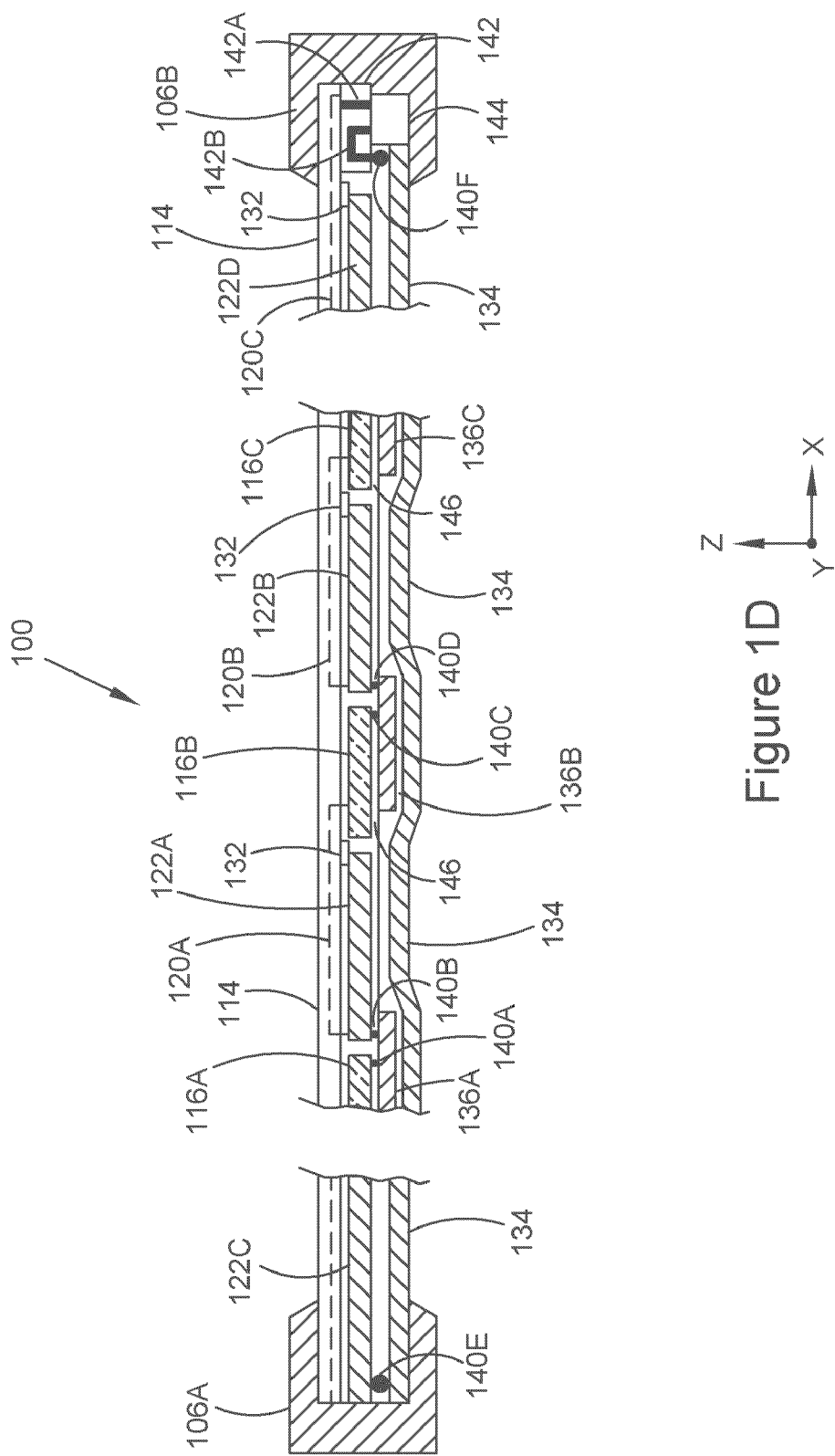

The isolation strip 132 is disposed lengthwise above the region 130B so as to electrically isolate the substrate 124 from the top layer 108, as best seen in FIG. 1D, which depicts a cross-sectional view of the PV module 100. More particularly, and with combined reference to FIGS. 1B-1D, when the PV module 100 is assembled as shown in FIG. 1D, the power collection grid 120A is configured to contact the TCO 128 of PV strip 122A. Any contact between the power collection grid 120A and the substrate 124 of PV strip 122A could short out the PV strip 122A. Accordingly, because the TCO 128 is absent from the region 130B and because the thin-film active layer 126 is relatively thin and may have one or more inclusions, the isolation strip 132 is applied to the region 130B so as to prevent the power collection grid 120A from contacting the substrate 124 of PV strip 122A.

Returning to FIG. 1B, the bottom layer 112 includes a conductive backsheet 134 and a plurality of bottom layer conductive strips 136A, 136B, 136C (collectively "bottom layer conductive strips 136") that are laminated or otherwise secured to a top surface of the bottom layer 112. In the illustrated embodiment, a first bottom adhesive layer 138 secures the bottom layer conductive strips 136 to the top surface of bottom layer 112. Alternately or additionally, the first bottom adhesive layer 138 is substantially electrically insulating so as to isolate the PV strips 122 and bottom layer conductive strips 136 from the conductive backsheet 134. For example, the first bottom adhesive layer 138 may include dielectric material(s).

Optionally, each of bottom layer conductive strips 136 includes one or more electrical contact strips 140A, 140B, 140C, 140D (collectively "contact strips 140"). For example, contact strips 140A, 140B are disposed on bottom layer conductive strip 136A while contact strips 140C, 140D are disposed on bottom layer conductive strip 136B. The contact strips 140, bottom layer conductive strips 136, top layer conductive strips 116 and power collection grid 120 are collectively configured to serially and redundantly interconnect the PV strips 122 together in series.

Accordingly, in this and other embodiments, the contact strips 140, bottom layer conductive strips 136, top layer conductive strips 116 and power collection grid 120 represent one example of a structural implementation of a means for serially and redundantly interconnecting the PV strips 122 together. Other means for serially and redundantly interconnecting PV strips in a PV module together can be implemented with contact strips, bottom layer conductive strips, top layer conductive strips, power collection grids, gimbal strips, or stitched contact strips, either alone or in any combination.

In particular, with combined reference to FIGS. 1B-1D, when the PV module 100 is assembled as shown in FIG. 1D, the top layer conductive strip 116A is connected to the substrate 124 of PV strip 122A via contact strip 140A, bottom layer conductive strip 136A and contact strip 140B. The TCO 138 of PV strip 122A is connected to top layer conductive strip 116B via power collection grid 120A, and the top layer conductive strip 116B is connected through contact strip 140C, bottom layer conductive strip 136B and contact strip 140D to the substrate (not labeled) of PV strip 122B. Accordingly, the PV strips 122 are serially interconnected.

The interconnections between PV strips 122 are redundant insofar as the interconnections are not limited to discrete connection points, but rather include continuous connection areas along the lengths of the PV strips 122. In particular, the top layer conductive strips 116, power collection grid 120, bottom layer conductive strips 136 and contact strips 140 are continuous along the length of PV module 100 in some examples such that the PV strips 122 are continuously interconnected to each other.

With continued reference to FIG. 1B, the conductive backsheet 134 is configured to form a current return path for the series-connected PV strips 122. As such, in some embodiments, the conductive backsheet 134 is electrically connected to a first PV strip (not shown) and a last PV strip (not shown) to form a current return path, along with an electronic circuit layer and one or more power conversion circuits at the connection with the first or last PV strip in some examples. For instance, as best seen in FIG. 1D, the conductive backsheet 134 is connected to first PV strip 122C via contact strip 140E and to last PV strip 122D via contact strip 140F, electronic circuit layer 142, power conversion circuits 144 and power collection grid 120C. In some examples, the conductive backsheet 134 is connected to the first PV strip 122C using laser welding, ultrasonic welding, or other suitable method(s).

As shown in FIG. 1D, edge caps 106 encapsulate the longitudinal edges of the PV module 100. The term "longitudinal edges" refers to the edges of the PV module 100 that are substantially parallel to the PV strips 122. In some embodiments, edge caps 106 include sealant to ensure a waterproof seal between the edge caps 106A and PV module 100. Edge cap 106B is further configured to encapsulate electronic circuit layer 142 and power conversion circuits 144.

The electronic circuit layer 142 is a flexible circuit in some examples that can be laminated along an edge of the top layer 108 and/or bottom layer 112 during manufacturing of the PV module 100. In the illustrated embodiment, the electronic circuit layer 142 is laminated to the top layer 108, as best seen in FIG. 1D. Optionally, the electronic circuit layer 142 has an input bus including a plurality of first vias 142A. The TCO 128 of last PV strip 122D is connected to an input of power conversion circuits 144 through the power collection grid 120C and first vias 142A.

The electronic circuit layer 142 additionally has a current return path including a plurality of second vias 142B. The second vias 142B and contact strip 140F connect the power conversion circuits 144 to the conductive backsheet 134 to complete a current return path for the PV module 100. The electronic circuit layer 142 can be attached to the conductive backsheet 134 using ultrasonic welding or other suitable method(s).

Although not shown, the electronic circuit layer 142 in some embodiments includes one or more digital control lines allowing one or more control modules (not shown) to communicate with each other and/or the power conversion circuits 144.

Optionally, the electronic circuit layer 142 including first and second vias 142A, 142B and/or digital control lines is laminated to the PV module 100 during lamination of the top layer 108, active layer 110 and/or bottom layer 112. Alternately or additionally, discrete electronic boxes including power conversion circuits 144 are subsequently attached to the electronic circuit layer 142. One example of a PV module that implements discrete boxes for power conversion circuits that are attached to an electronic circuit layer subsequent to laminating the electronic circuit layer to the PV module is disclosed by FIGS. 18A-18C and the associated description.

Returning to FIG. 1D, the electronic circuit layer 142 extends beyond the edge of the conductive backsheet 134 in the positive x-direction in the example of FIG. 1D. Alternately or additionally, the conductive backsheet 134 can be configured to extend beyond the edge of the electronic circuit layer 142 in the positive x-direction.

Alternately or additionally, in some embodiments, the top layer 108 and/or the bottom layer 112 extend beyond the edges of the active layer 110 in the x- and y-directions and the extensions are laminated to each other, the extensions providing an extended diffusion distance for moisture penetration and for additional encapsulation over the electronic circuit layer 142 and associated bus layers, and optionally over the power conversion circuits 144.

Optionally, as best seen in FIG. 1B, the bottom layer 112 further includes a second bottom adhesive layer 146 configured to secure the top layer 108, active layer 110 and bottom layer 112 together.

Alternately or additionally, a black back skin layer or other thermally emissive layer is provided on the bottom surface, e.g., the negative z surface, of the conductive backsheet 134. Such an emissive layer on the conductive backsheet 134 in some embodiments enhances PV module 100 cooling and increases the radiation effect off the bottom surface of the PV module 100.

Figure 2A:
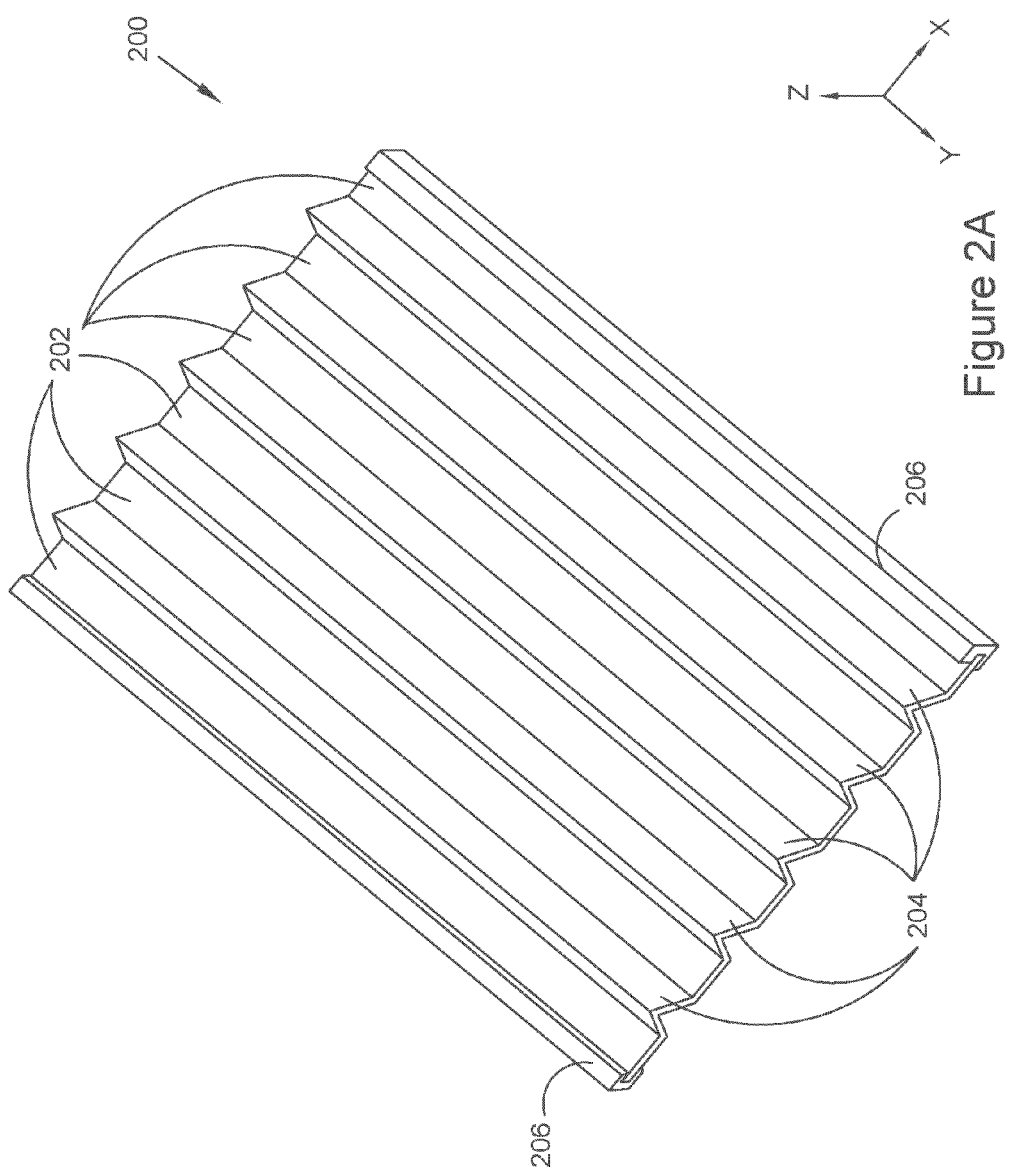
FIGS. 2A-2B disclose aspects of an example corrugated PV module including shaped interconnecting regions.
Figure 2B:
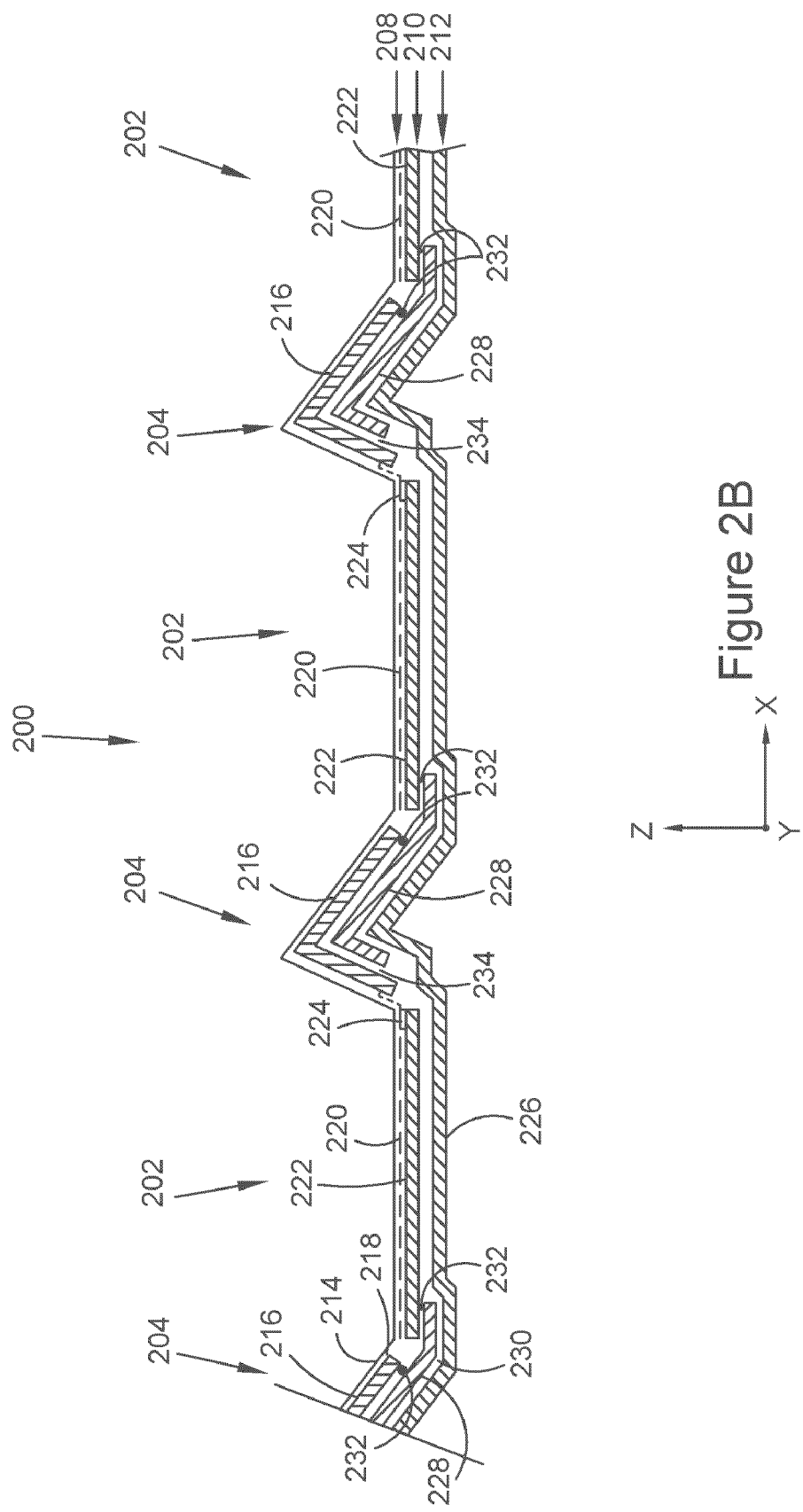

In some embodiments, the PV module 100 is implemented in the configuration shown in FIG. 1A. Alternately or additionally, the interconnecting regions 104 can be shaped to reflect and concentrate reflected light onto PV regions 102. For example, FIGS. 2A and 2B illustrate a perspective view and a partial cross-sectional view of a PV module 200 having PV regions 202 and shaped interconnecting regions 204. In some embodiments, the percentage of the surface area of the PV regions 202 to the remaining surface area of the PV module 200 is in a range between 20% to 80%, or less than 20% or greater than 80%. The shaped interconnecting regions 204 are concentrators in some examples. As such, the shaped interconnecting regions 204 reflect and concentrate light onto PV regions 202, reducing the amount of PV region 202 surface area needed to produce an equivalent amount of power.

Although the PV module 200 includes shaped concentrator regions 204, the PV module 200 is otherwise substantially similar to the PV module 100 of FIGS. 1A-1D. For example, as best seen in FIG. 2A, the PV module 200 includes longitudinally continuous edge caps 206. As further seen in FIG. 2B, the PV module 200 includes a top layer 208, active layer 210, and bottom layer 212.

With continued reference to FIG. 2B, the top layer 208 includes a substantially transparent film 214, a plurality of top layer conductive strips 216, and a top adhesive layer 218. A power collection grid 220 is formed in the bottom surface of substantially transparent film 214.

The active layer 210 includes a plurality of PV strips 222 that are longitudinally continuous and substantially flexible in some embodiments. Alternately or additionally, the PV strips 222 include thin-film PV materials. An isolation strip 224 is disposed along a longitudinal edge of each PV strip 222 in some examples.

The bottom layer 212 includes a conductive backsheet 226 and a plurality of bottom layer conductive strips 228. A first bottom adhesive layer 230 secures the bottom layer conductive strips 228 to the conductive backsheet 226. Optionally, each of bottom layer conductive strips 228 includes one or more electrical contact strips 232. A second bottom adhesive layer 234 secures the top layer 208, active layer 210 and bottom layer 212 together.

In some embodiments, the PV modules 100, 200 include a constrained layer damper to provide passive vibration damping introduced by wind or other environmental effects. Generally, a constrained layer damper includes two metal materials sandwiching a visco-elastic material. For example, with combined reference to FIGS. 1D and 2B, in some embodiments, the PV modules 100, 200 include top layer conductive strips 116, 216 and bottom layer conductive strips 136, 228 that are made of metal, where the top layer conductive strips 116, 216 and bottom layer conductive strips 136, 228 sandwich second bottom adhesive layer 146, 234 made of a viscoelastic material. Accordingly, the top layer conductive strips 116, 216, bottom layer conductive strips 136, 228 and second bottom adhesive layer 146, 234 form a constrainer layer damper. In some embodiments, the constrained layer damper is effective at absorbing sound induced vibrations in the frequency range of 50 Hz to 10 kHz, or even less than 50 Hz or more than 10 kHz.

II. Top Layer

Turning next to FIGS. 3A-3B, an example top layer 300 is disclosed that may correspond to one or both of the top layers 108, 208 of FIGS. 1A-2B. In more detail, FIG. 3A is a perspective view of the top layer 300 including a plurality of power collection regions 302A, 302B (collectively "power collection regions 302") and a plurality of interconnecting regions 304. FIG. 3B is a cross-sectional view of a portion of the top layer 300. Although the top layer 300 is shown with only two power collection regions 302 and two interconnecting regions 304, in other embodiments the top layer 300 includes more or less than two power collection regions 302 and two interconnecting regions 304.

As best seen in FIG. 3B, the top layer 300 includes a substantially transparent film 306 and a plurality of top layer conductive strips 307 (only one top layer conductive strip 307 is shown in FIG. 3B). The substantially transparent film 306 is approximately 15-300 microns thick in some examples. In the illustrated embodiment, the substantially transparent film 306 includes a weatherability film 308, a first top adhesive layer 310, a barrier layer film 312, and a second top adhesive layer 314.

In some embodiments, the weatherability film 308 is configured to provide ultraviolet ("UV") protection to a corresponding active layer and/or to be substantially resistant to hydrolysis such that exposure to moisture does not substantially break down the weatherability film 308. Accordingly, in some examples the weatherability film 308 includes fluorinated material(s) such as polytetrafluoroethylene ("PTFE"), poly methyl methacrylate ("PMMA"), or the like or any combination thereof.

The first top adhesive layer 310 is configured to secure the weatherability film 308 and the barrier layer film 312 together. The barrier layer film 312 is configured to be substantially impenetrable to water and moisture. The second top adhesive layer 314 is configured to secure the top layer conductive strips 307 to the top layer 300. In some examples, one or both of the first and second top adhesive layers 310, 314 includes ethylene-vinyl acetate ("EVA") or other suitable adhesive(s) and is 5 to 100 microns thick, or even less than 5 microns or more than 100 microns thick.

The top layer 300 has been discussed as including a substantially transparent film 306 made up of a weatherability film 308 and barrier layer film 312. Alternately or additionally, the weatherability film 308 and barrier layer film 312 can be implemented in separate films rather than in the substantially transparent film 306.

The power collection regions 302A, 302B collectively include a power collection macro grid 316 intermittently formed on a bottom surface of the top layer 300. The power collection macro grid 316 corresponds to the power collection grid 120, 220 of FIGS. 1A-2B in some examples. The formation of the power collection macro grid 316 is intermittent insofar as the power collection macro grid 316 is only formed in power collection regions 302, rather than throughout the top layer 300.

Generally, the power collection macro grid 316 is configured to collect power generated by corresponding PV strips positioned beneath the power collection regions 302. As such, the power collection macro grid 316 within each power collection region 302 includes one or more interconnected grid lines 318, 320, 322 configured to contact the TCO of a corresponding PV strip and the top of an adjacent top layer conductive strip 307 so as to collect the power off the top of the PV strip and send it to the adjacent top layer conductive strip 307. For this reason, the power collection macro grid 306 is intermittently formed on the bottom surface of the top layer 300 in some examples. Accordingly, the power collection macro grid 316 is one example of a structural implementation of a means for collecting power from a plurality of PV strips.

As already mentioned above, the power collection macro grid 316 within each power collection 302 includes one or more interconnected grid lines 318, 320, 322. One example of a grid pattern of interconnected grid lines of power collection macro grid 316 is shown in the power collection regions 302 of FIG. 3A, although other grid patterns can alternately or additionally be implemented. Further, in some embodiments, the interconnected grid lines 318, 320, 322 are 50 to 200 microns wide in the x-direction and 50 to 200 microns deep in the z-direction.

The power collection macro grid 316 can be formed using any method(s) and/or material(s) now known or later developed. For example, in some embodiments, the power collection macro grid 316 is formed by partially perforating a bottom surface 324 of the top layer 300A through the substantially transparent film 306 to form a desired grid pattern. In some examples, the penetration depth of the perforations into the substantially transparent film 306 is in a range of 30% to 50% of the thickness of the substantially transparent film 306, or even less than 30% or more than 50% in some embodiments. The partial perforations can be formed using a laser, for example.

After partially perforating the bottom surface 324 to form the grid pattern, a screen printing or other technique can be used to fill the perforated areas with a conductive material that is in a paste or other spreadable form. Optionally, the conductive material is cured to drive off organic materials from the conductive material. Alternately or additionally, the screen printing or other technique, such as stenciling, is tailored to form protruding profiles on bottom surfaces of the interconnected grid lines 318, 320, 322.

Such protruding profiles are configured to ensure contact of the interconnected grid lines 318, 320, 322 with a TCO of an underlying PV strip while substantially preventing the interconnected grid lines 318, 320, 322 from shorting to the substrate of the underlying PV strip. In more detail, PV strips made from thin-film PV material can include many defects and/or inclusions. By forming protruding profiles on bottom surfaces of interconnected grid lines 318, 320, 322, the amount of contact area between the interconnected grid lines 318, 320, 322 and TCO of the underlying PV strip is smaller than if the bottom surfaces of interconnected grid lines 318, 320, 322 were substantially planar, such that the likelihood of the interconnected grid lines 318, 320, 322 contacting a defect/inclusion and shorting to the substrate of the PV strip is reduced.

Optionally, the shape and dimensions of the interconnected grid lines 318, 320, 322 allow for gridline failure in the event of a short circuit to the substrate of the PV strip. Accordingly, in some examples, in the event of a short circuit to the substrate of an underlying PV strip, a large current will flow into the affected interconnected grid line 318, 320, 322 in the area of the short circuit. Accordingly, the interconnected grid lines 318, 320, 322 are configured to open up in the region of the short circuit from the large current flow so as to isolate the short circuit.

Figure 4C:
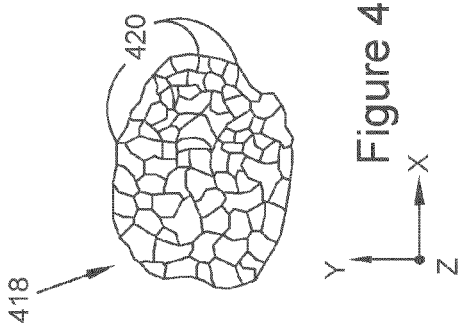
FIGS. 4A-4C illustrate a second example top layer that may be implemented in the PV modules according to some embodiments.
Figure 4B:
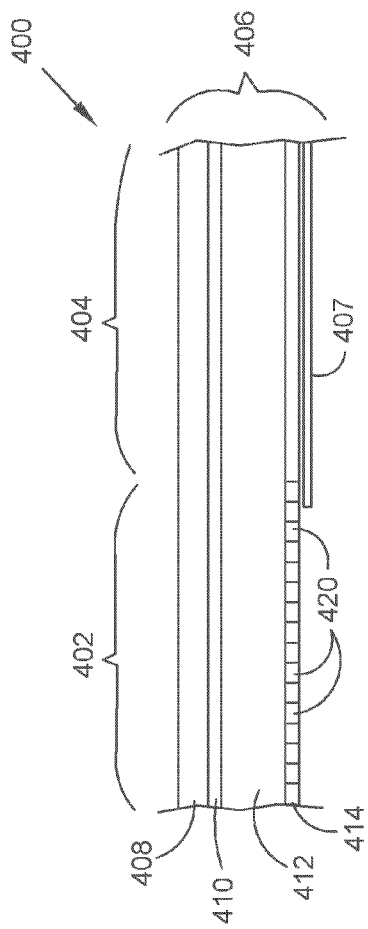
Figure 4A:
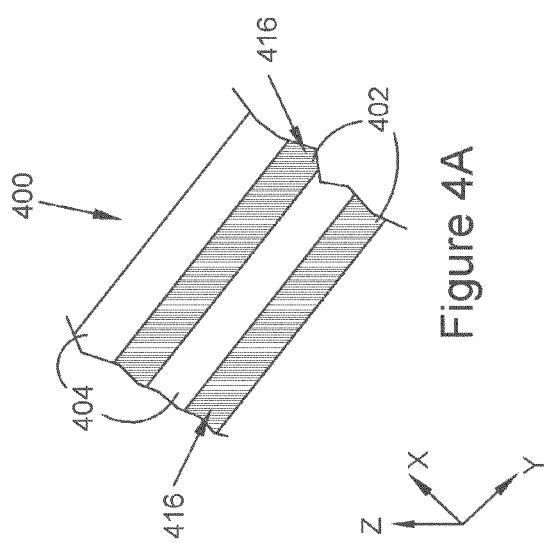

Turning next to FIGS. 4A-4B, another example top layer 400 is disclosed that may correspond to one or both of the top layers 108, 208 of FIGS. 1A-2B. FIG. 4 is a perspective view of the top layer 400 including a plurality of power collection regions 402 and a plurality of interconnecting regions 404. FIG. 4B is a cross-sectional view of a portion of the top layer 400. FIG. 4C is a top view of a portion of a power collection region 402. Although the top layer 400 is shown with only two power collection regions 402 and two interconnecting regions 404, in other embodiments the top layer 400 includes more or less than two power collection regions 402 and two interconnecting regions 404.

The top layer 400 of FIGS. 4A-4C is similar in some respects to the top layer 300 of FIGS. 3A-3B. In particular, as seen in FIG. 4B, top layer 400 includes a substantially transparent film 406 and a plurality of top layer conductive strips 407 (only one top layer conductive strip 407 is shown in FIG. 4B). Substantially transparent film 406 includes a weatherability film 408, a first top adhesive layer 410, a barrier layer film 412, and a second top adhesive layer 414.

With continued reference to FIG. 4B, the power collection regions 402 collectively include a power collection nano grid 416 intermittently formed on a bottom surface of top layer 400. The power collection nano grid 416 corresponds to the power collection grid 120, 220 of FIGS. 1A-2B in some examples. The power collection nano grid 416 is similar in function to the power collection macro grid 316 of FIGS. 3A-3B. Namely, the power collection nano grid 416 is configured to collect power generated by corresponding PV strips positioned beneath the power collection regions 402.

Generally, the power collection nano grid 416 within each power collection region 402 includes a plurality of conductive nano particles arranged in an interconnected network 418 of conductive traces 420. FIG. 4C illustrates one example of such an interconnected network 418 of conductive traces 420.

The power collection nano grid 416 can be formed using any method(s) and/or material(s) now known or later developed. For example, in some embodiments, the power collection nano grid 416 is formed by using a thin emulsion or other technique to apply an emulsion including nano-scale conductive particles to the bottom surface of top layer 400. The emulsion is then annealed at an appropriate temperature to form the interconnected network 418 of conductive traces 420. The nano-scale conductive particles can include silver and/or other conductive metal(s) that self-assemble into the interconnected network 418. In some embodiments, the power collection nano grid 416 is 80% to 95% transparent to light.

Optionally, the power collection nano grid 416 is formed on the entire bottom surface of top layer 400, followed by ablating the power collection nano grid 416 from the interconnecting regions 404 so that the power collection nano grid 416 is confined to the power collection regions 402. Alternately or additionally, the power collection nano grid 416 is formed only in the power collection regions 402 by applying the emulsion to the power collection regions 402 using a spatially controlled process.

As best seen in FIG. 4B, the conductive traces 420 are disposed in the second top adhesive layer 414. The second top adhesive layer 414 can be applied to the top layer 400 prior to formation of the power collection nano grid 416 and/or in such a way that the second top adhesive layer 414 is contained in regions between the individual conductive traces 420 to allow the conductive traces 420 to contact the TCO of the underlying PV strips.

FIGS. 3A-3B illustrate a top layer 300 including a power collection micro grid 316 and FIGS. 4A-4C illustrate a top layer 400 including a power collection nano grid 416. Embodiments disclosed herein include top layers having either a power collection micro grid or a power collection nano grid as well as top layers having both a power collection micro grid and a power collection nano grid. In some embodiments including both a power collection macro grid and a power collection nano grid, the power collection nano grid is applied to the top layer after formation of the power collection micro grid.

In the examples of FIGS. 3B and 4B, each top layer 300, 400 includes a plurality of top layer conductive strips 307, 407. In some embodiments, each of the top layer conductive strips 307, 407 includes rolled or extruded metal, laminated metal and plastic, or the like or any combination thereof. The metal used in top layer conductive strips 307, 407 may include one or more of aluminum, stainless steel, copper, tin, nickel, aluminum, copper, tin, silver, non-stainless steel low carbon steel, or the like or any combination thereof. In some embodiments, each of the top layer conductive strips 307, 407 includes a coating of nickel, aluminum, copper, tin, silver, or strained layers of polyethylene terephthalate. In some embodiments, the conductivity of the top layer conductive strips 307, 407 is in the range of $10^{-6}$ ohm-meters to $10^{-8}$ ohm-meters. Alternately or additionally, top layer conductive strips 307, 407 are approximately 0.5 to 10 milli-inches ("mils") thick (e.g., in the z-direction) and/or are plastically deformable. Alternately or additionally, top layer conductive strips 307, 407 are formed by rolling, casting, depositing, or other suitable method(s).

Some embodiments of the top layers 300, 400 include an overlap along one edge of top layer conductive strips 307, 407 with the power collection macro or nano grids 316, 416 as shown in FIGS. 3B and 4B. The overlap is approximately 0.5 to 1 millimeter ("mm") in some examples. At the overlap, the top layer conductive strips 307, 407 are configured to electrically contact the power collection macro or nano grids 316, 416. To this end, in some embodiments, the top layer conductive strips 307, 407 make electrical contact with the power collection macro or nano grids 316, 416 in the area of overlap using mechanical contact, welding, ultrasonic bonding, presolder reflow, indium solder, conductive tape, or the like or any combination thereof.

Figure 5:
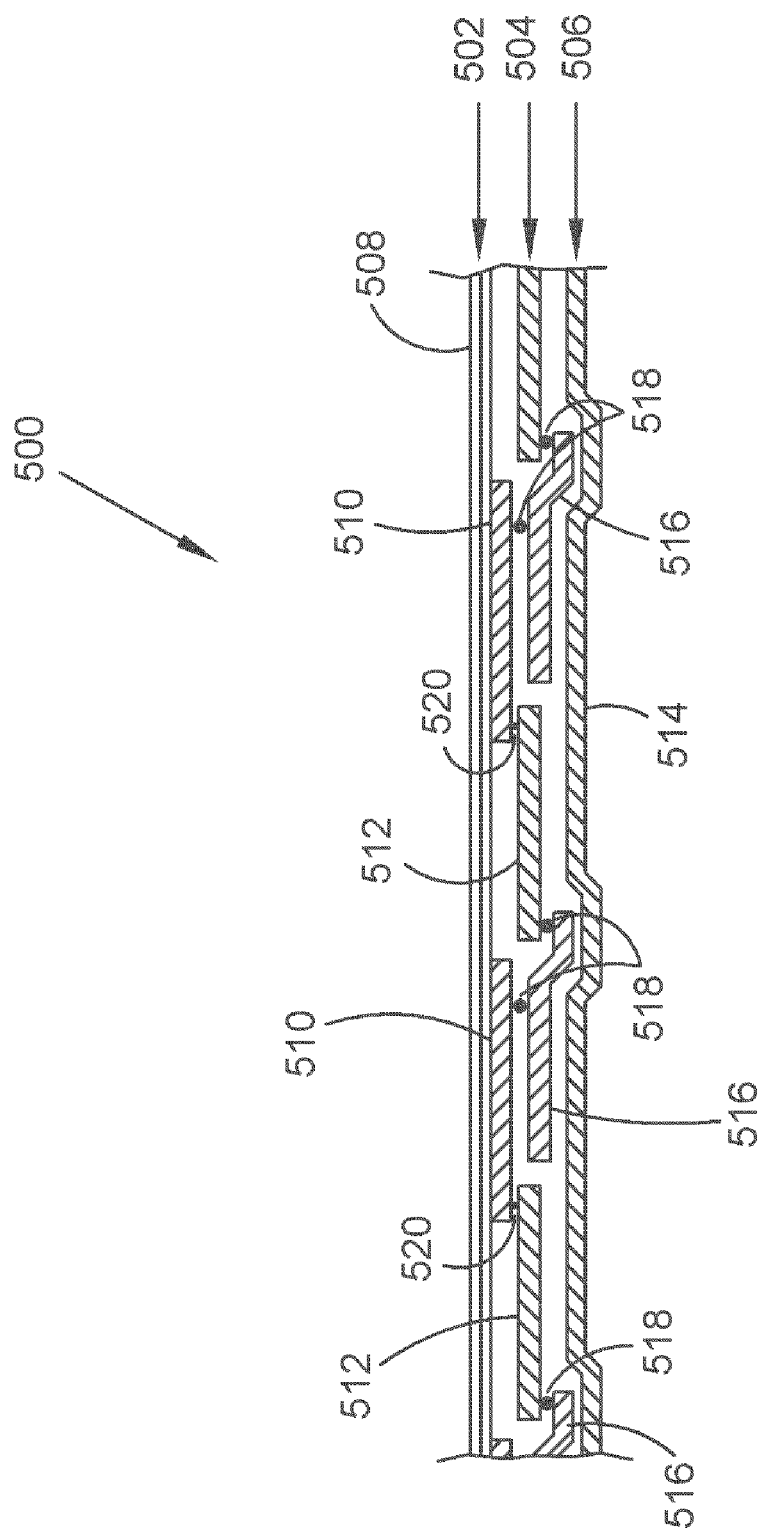
FIG. 5 depicts an example PV module that implements top layer conductive strips without a power collection macro or nano grid for collecting power.

The embodiments described herein are not limited to PV modules having top layers that include a power collection grid, including a power collection macro grid or power collection nano grid. For example, FIG. 5 illustrates a partial cross-section of a PV module 500 lacking a power collection grid.

As shown, the PV module 500 is similar in some respects to the PV modules 100 and 200 of FIGS. 1A-2B and includes a top layer 502, an active layer 504 and a bottom layer 506. The top layer 502 includes a substantially transparent film 508 and a plurality of top layer conductive strips 510. The active layer 504 includes a plurality of PV strips 512. The bottom layer 506 includes a conductive backsheet 514 and a plurality of bottom layer conductive strips 516. Contact strips 518 are disposed on the bottom layer conductive strips 516 to connect adjacent pairs of top layer conductive strips 510 and PV strips 512.

In contrast to the PV modules 100, 200 of FIGS. 1A-2B, however, the PV module 500 lacks a power collection grid disposed above the PV strips 512 for collecting power from the TCO of each PV strip 512 and connecting the TCO of each PV strip 512 to an adjacent top layer conductive strip 510. Instead, each top layer conductive strip 510 extends over the top of an adjacent PV strip 512 and contacts the TCO of the adjacent PV strip 512 through contact strips 520. Thus, power generated by each PV strip 512 is collected by the adjacent top layer conductive strips 510 without the need for a power collection grid. Accordingly, the top layer conductive strips 510 are another example of a structural implementation of a means for collecting power from a plurality of PV strips 512.

III. Active Layer

Figure 6:
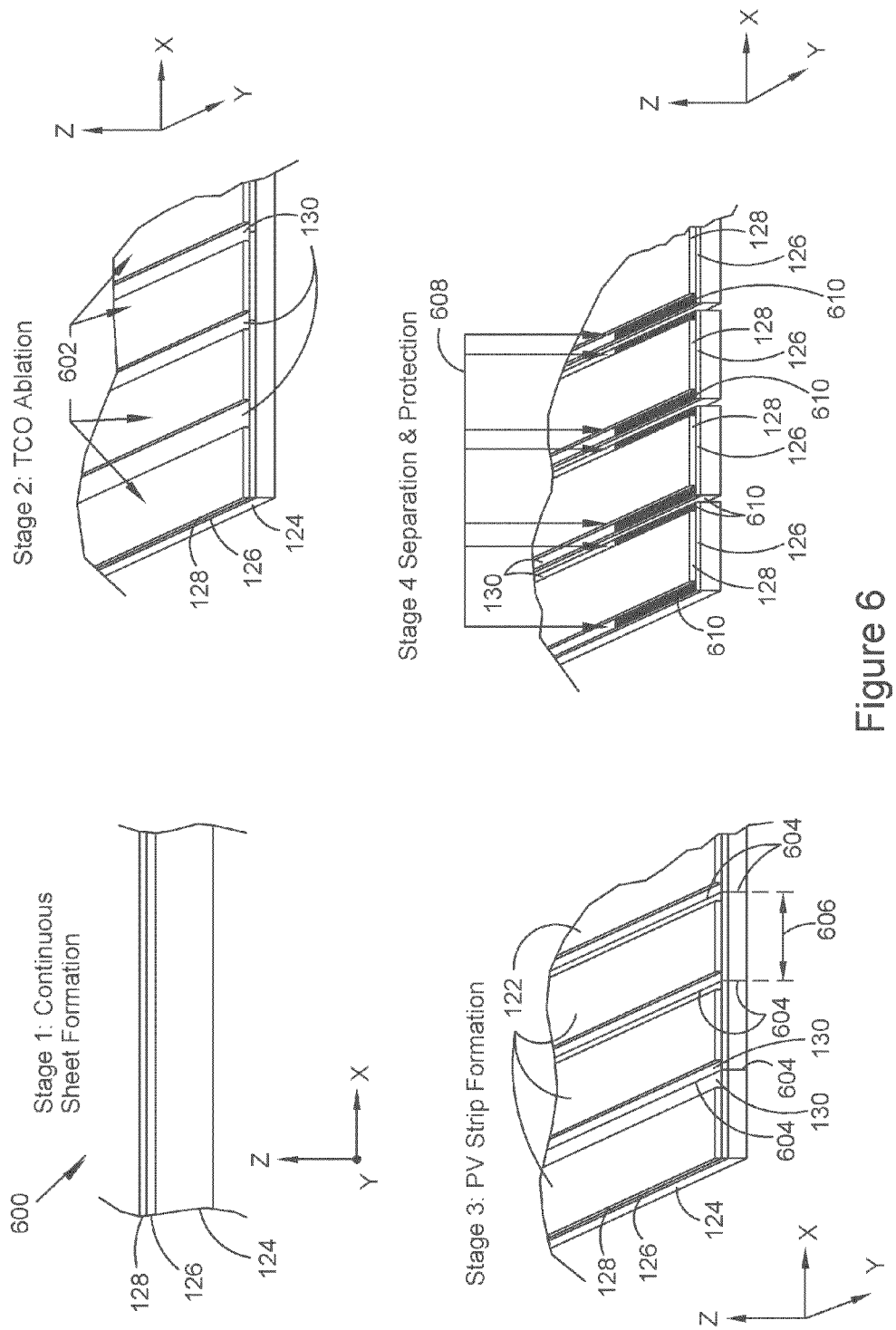
FIG. 6 discloses a process flow for forming PV strips from a continuous sheet of PV material.

The active layer of PV modules according to some embodiments is prepared from a continuous sheet of thin-film PV material. Such continuous sheets of thin-film PV material can be formed in virtually any desired dimensions and/or on flexible substrates suitable for roll-to-roll processing of the type described below. For example, FIG. 6 illustrates an example processing flow for preparing the active layer 110 of PV module 100.

In stage 1, a continuous sheet 600 of thin-film PV material ("PV sheet 600") is formed. As used herein, the term "continuous" as applied to the PV sheet 600 means that the PV sheet 600 is substantially continuous in the arbitrarily-defined x-y plane over the dimensions of the PV sheet 600 in the x- and y-directions, as opposed to being divided into discrete solar cells. Thus, it is appreciated that the PV sheet 600 has finite dimensions in the x- and y-directions and the PV sheet 600 is substantially continuous along the entirety of the finite dimensions in the x- and y-dimensions. As shown in stage 1, the PV sheet 600 includes substrate 124, thin-film active layer 126 and TCO 128, discussed above with respect to FIGS. 1A-1D.

In stage 2, TCO-free regions 130 are formed by ablating the TCO 128 from the PV sheet 600 in the regions 130. In some embodiments, the width in the x-direction of each region 130 is approximately 100 microns to 400 microns. Alternately, the width of each region 130 is less than 100 microns or more than 400 microns.

Optionally, the TCO 128 is ablated from regions 130 by directing a laser at the regions 130. The laser used to ablate TCO 128 from regions 130 can include, for instance, a quadrupled Nd:YAG laser, a quadrupled Nd:YLF laser, a fiber pumped laser, a solid state laser, an excimer laser, a gas laser, or the like or any combination thereof. In some embodiments, the laser is configured to emit light in the near-ultraviolet ("near-UV") wavelength range, e.g., 400 nanometers ("nm") to 300 nm. Alternately, the laser is configured to emit light in the UV wavelength range, e.g., 400 nm to 10 nm.

The formation of regions 130 during stage 2 isolates the PV sheet 600 into PV regions 602 that are ultimately separated from each other to form PV strips 122 in stage 3. In particular, as shown in stage 3 of FIG. 6, PV strips 122 are formed by cutting through regions 130. The cuts are abstractly represented by lines 604 in stage 3. In some examples, the cuts 604 are made substantially in the middle of regions 130. Alternately or additionally, the regions 130 are formed and the cuts 604 are made such that a width 606 of each PV strip 122 is in the range of 25 mm to 200 mm. The width 606 of PV strips 122 is substantially the same from one PV strip 122 to another. Alternately or additionally, the width 606 of PV strips 122 is variable from one PV strip 122 to another.

Optionally, the PV strips 122 are formed by directing a laser at the regions 130 along the cutting lines 604. The laser used to cut through regions 130 can include, for instance, an Nd:YAG laser, an Nd:YLF laser, a fiber pumped laser, a carbon dioxide laser, an excimer laser, a solid state laser, a gas laser, or the like or any combination thereof. In some embodiments, the laser is configured to emit light in the near-infrared ("near-IR") wavelength range, e.g., 750 nm to 1400 nm, and/or up to a wavelength of 10 microns or beyond.

Alternately, the PV strips 122 can be formed using a mechanical cutter, rather than a laser cutter.

In stage 4, the PV strips 122 are separated, using, for instance, an inline separator (not shown). The PV strips 122 are separated to include 200 microns to 500 microns of spacing in some embodiments. Alternately or additionally, a dispensing system 608 applies a protection layer 610 to the exposed regions 130 to protect the thin-film active layer 126 and/or substrate 124 against moisture ingress, chemical attack and/or ionic contamination. In some examples, the protection layer 610 includes dielectric, sealant, desiccant, a silicone-based product, or the like or any combination thereof.

Optionally, after processing the PV sheet 600 as shown in FIG. 6, the separated PV strips 122 are laminated to a top layer and/or bottom layer as explained in greater detail below.

IV. Bottom Layer

In the examples of FIGS. 1A-2B, the bottom layer 112, 212 of PV module 100, 200 according to some embodiments includes bottom layer conductive strips 136, 228. In some embodiments, each of the bottom layer conductive strips 136, 228 includes rolled or extruded metal, laminated metal and plastic, or the like or any combination thereof. Alternately or additionally, the bottom layer conductive strips 136, 228 are approximately 0.5 to 10 mils thick (e.g., in the z-direction). Optionally, the bottom layer 112, 212 of PV module 100, 200 according to some embodiments is prepared by laminating the bottom layer conductive strips 136, 228 over the first bottom adhesive layer 138, 230 onto conductive backsheet 134, 226.

Although not required, the conductive backsheet 134, 226 is a conductive and environmentally protective film in some embodiments. For example, the conductive backsheet 134, 226 can include aluminum with or without a polyethylene terephthalate ("PET") film or other suitable material(s) on its bottom surface. Alternately or additionally, the bottom layers 112, 212 include an insulating layer between the conductive backsheet 134, 226 and the bottom layer conductive strips 136, 230, which insulating layer is made of PET or PMMA in some examples. Optionally, the insulating layer is a PET layer with separate EVA sheets of adhesive for attachment, or a PET layer with co-extruded faces of EVA on the PET layer, or some combination thereof. Alternately or additionally, the conductive backsheet 134, 226 is an extruded, cast, rolled, or other type of metal film attached to the insulating layer. Optionally, the exposed (e.g., bottom) surface of the conductive backsheet 134, 226 is black and/or has an emissivity greater than 0.6, allowing for improved thermal emissions to aid in PV module 100, 200 cooling.

In the PV modules 100, 200 of FIGS. 1A-2B, the bottom layer conductive strips 136, 228 cooperate with the top layer conductive strips 116, 216 and power collection grid 120, 220 to serially and redundantly interconnect the PV strips 122, 222 together. In other embodiments, bottom layer conductive strips can be configured to serially and redundantly interconnect PV strips together without top layer conductive strips and/or power collection grids.

For example, FIG. 7A discloses a cross-sectional view of an example PV module 700 having double overlap bottom layer conductive strips such that top layer conductive strips and/or a power collection grid are not implemented in the PV module 700. In more detail, the PV module 700 includes a top layer 702, active layer 704 and bottom layer 706. The top layer 702 includes a substantially transparent film 708 and a plurality of gimbal strips 710. The active layer 704 includes a plurality of PV strips 712. The bottom layer 706 includes a plurality of bottom layer conductive strips 714 and a conductive backsheet 715.

As shown in FIG. 7A, each gimbal strip 710 includes two contact strips 710A, 710B disposed on a bottom surface of the gimbal strip 710. Further, each bottom layer conductive strip 714 includes one or more contact strips 714A, 714B disposed on the right side of each bottom layer conductive strip 714 beneath a corresponding PV strip 712. The contact strips 710A, 710B, 714A, 714B include a relatively soft, electrically conductive material that is rounded in some embodiments.

The left contact strip 710A of each gimbal strip 710 contacts the TCO of the PV strip 712 immediately to the left of the gimbal strip 710, electrically connecting the TCO of the PV strip 712 to the gimbal strip 710. The right contact strip 710B contacts a top surface of the bottom layer conductive strip 714 immediately to the right of the gimbal strip 710 such that the TCO of each PV strip 712 is electrically connected to the bottom layer conductive strip 714 immediately to the right of the PV strip 712. The contact strips 714A, 714B on each bottom layer conductive strip 714 contact the substrate of the PV strip 712 immediately to the right of the bottom layer conductive strip 714 such that the substrate of each PV strip 712 is electrically connected to the bottom layer conductive strip 714 immediately to the left of the PV strip 712. In this manner, the bottom layer conductive strips 714 and gimbal strips 710 serially and redundantly interconnect the PV strips 712 without any top layer conductive strips.

In some embodiments, gimbal strips 710 are made from a continuous sheet of gimbal material that is optionally in a roll form. In this and other examples, the continuous sheet of gimbal material is slit, separated, and laminated to the top layer 702 at appropriate locations to interconnect the TCO of each PV strip 712 to the bottom layer conductive strip 714 immediately to the right of the PV strip 712. Alternately or additionally, adhesives, epoxies, tapes, or other materials are used to ensure that contact strips 710A, 710B of gimbal strip 710 are securely connected to the TCO of the corresponding PV strip 712 or the top surface of the corresponding bottom layer conductive strip, respectively.

The slicing of the continuous sheet of gimbal material and/or the addition of the contact strips 710A, 710B can be performed using any method(s) and/or material(s) now known or later developed. Examples of such methods and/or materials include laser cutting, ball bonding, cladding, brazing, soldering, conductive epoxy dispense, vias and interconnects in flexible electronic circuits, or the like or any combination thereof.

In the example of FIG. 7A, each bottom layer conductive strip 714 partially overlaps the two PV strips 712 to the left and right of the bottom layer conductive strip 714 in the areas of overlap 716A, 716B. In some embodiments, a substantially electrically isolating material is disposed between the bottom layer conductive strips 714 and PV strips 712 at least in the areas of overlap 716A, 716B so as to electrically isolate the PV strips 712 from the bottom layer conductive strips 714 except where a connection is desired, e.g., along the contact strips 714A, 714B of bottom layer conductive strips 714. Optionally, the electrically isolating material includes a substantially electrically isolating adhesive or other suitable material(s).

Alternately or additionally, a substantially electrically isolating material is disposed between the bottom layer conductive strips 714 and PV strips 712 in the areas of overlap 716B, while a substantially electrically conducting material is disposed between the bottom layer conductive strips 714 and PV strips 712 in the areas of overlap 716A. The substantially electrically conducting material disposed in the areas of overlap 716A includes conductive adhesive, conductive epoxy, conductive tape, or the like, and can be used alone or in combination with contact strips 714A, 714B With additional reference to FIG. 7B, the PV module 700 is illustrated in a shaped configuration. In particular, the bottom layer conductive strips 714 have been formed to create concentrators 718.

Although not shown, in some embodiments, the module 700 includes a power collection grid formed in the top layer 702 above the PV strips 712. The power collection grid may be a power collection macro grid, a power collection nano grid, or any combination thereof. Alternately, the module 700 can be implemented without a power collection grid.

Figure 8A:
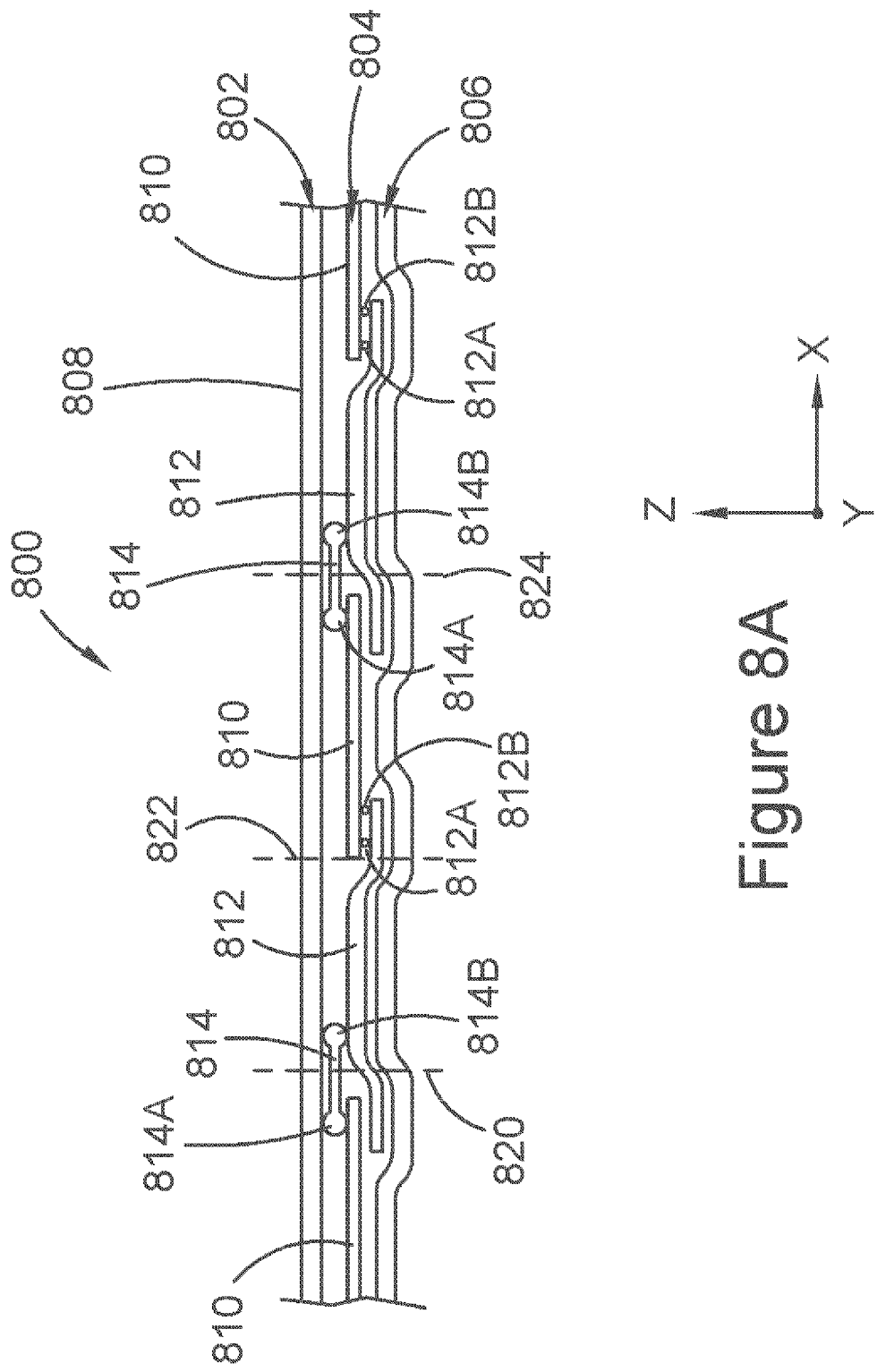
FIGS. 8A-8B illustrate an example PV module that implements bottom layer conductive strips and stitched contact strips without top layer conductive strips to serially and redundantly interconnect PV strips.

FIG. 8A discloses another example of a PV module 800 having double overlap bottom layer conductive strips such that top layer conductive strips and/or a power collection grid are not implemented in the PV module 800. The PV module 800 is similar in some respects to the PV module 700 of FIG. 7A. For example, the PV module 800 includes a top layer 802, active layer 804 and bottom layer 806. The top layer 802 includes a substantially transparent film 808. The active layer 804 includes a plurality of PV strips 810. The bottom layer 806 includes a plurality of bottom layer conductive strips 812 and a conductive backsheet 814.

Further, each bottom layer conductive strip 812 includes one or more contact strips 812A, 812B disposed on the right side of each bottom layer conductive strip 812 beneath a corresponding PV strip 810. The contact strips 812A, 812B of each bottom layer conductive strip 812 contact the substrate of the PV strip 810 immediately to the right of the bottom layer conductive strip 812 such that the substrate of each PV strip 810 is electrically connected to the bottom layer conductive strip 812 immediately to the left of the PV strip 810.

In contrast to the PV module 700 of FIG. 7A, however, the PV module 800 of FIG. 8A includes a plurality of stitched contact strips 814, rather than a plurality of gimbal strips 710. The stitched contact strips 814 include a plurality of contact points 814A, 814B. The left contact points 814A of each stitched contact strip 814 contact the TCO of the PV strip 810 immediately to the left of the stitched contact strip 814, electrically connecting the TCO of the PV strip 712 to the stitched contact strip 814. The right contact points 814B of each stitched contact strip 814 contact a top surface of the bottom layer conductive strip 812 immediately to the right of the stitched contact strip 814 such that the TCO of each PV strip 810 is electrically connected to the bottom layer conductive strip 812 immediately to the right of the PV strip 810. Further, as already mentioned above, the substrate of each PV strip 810 is electrically connected to the bottom layer conductive strip 812 immediately to the left of the PV strip 810. In this manner, the stitched contact strips 814 and bottom layer conductive strips 812 serially and redundantly interconnect the PV strips 810 together without any top layer conductive strips.

In some embodiments, the stitched contact strips 814 are made by stitching a wire into the top layer 802. The wire used is approximately 12 to 75 microns in diameter in some embodiments. Alternately or additionally, the wire includes copper, gold, aluminum, gold-coated tin wire, or other suitable material(s). Alternately or additionally, the wire includes an insulating outer layer. Each stitched contact strip 814 is stitched in an appropriate location of the top layer 802 so as to interconnect the TCO of each PV strip 810 to the bottom layer conductive strip 812 immediately to the right of the PV strip 810.

Figure 8B:
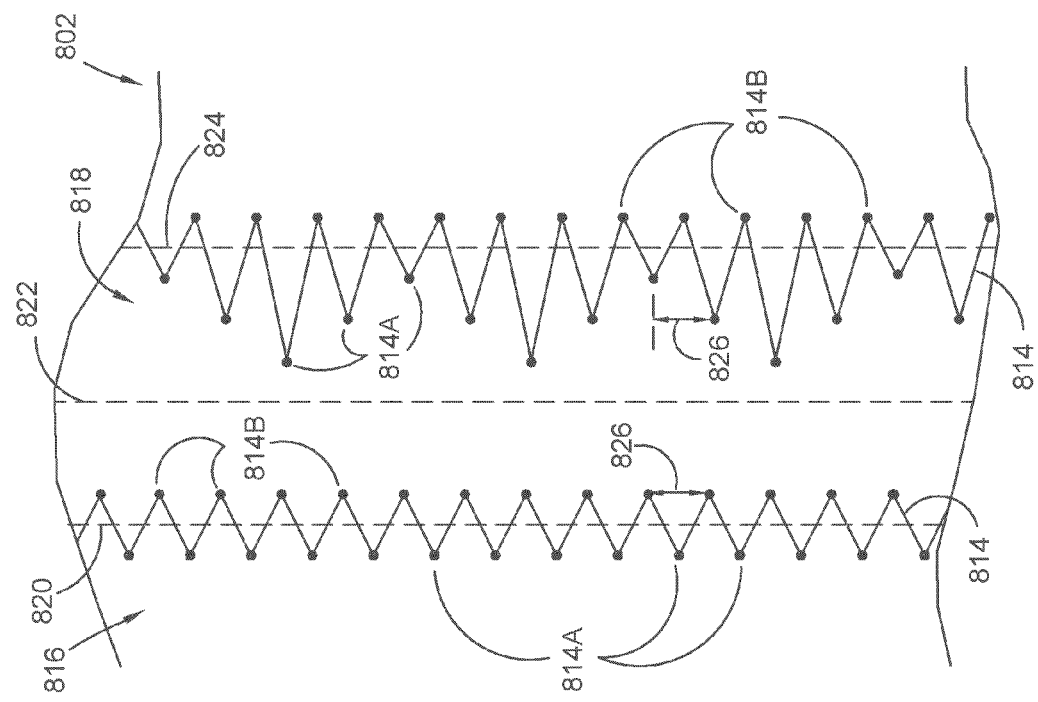

FIG. 8B illustrates several example stitch patterns 816, 818 for stitched contact strips 814 that can be implemented in the top layer 802 according to some embodiments. In some embodiments, every stitched contact strip 814 of PV module 800 implements the same stitch pattern 816 or 818, while in other embodiments multiple stitch patterns 816, 818 are implemented within the same PV module.

FIG. 8B further includes reference lines 820, 822, 824, all three of which are also depicted in FIG. 8A. Reference lines 820 and 824 correspond to separations in the x-direction of the PV strips 810 from the bottom layer conductive strips 812. Reference line 822 corresponds to the leftmost side of one of the PV strips 810.

With combined reference to FIGS. 8A and 8B, for both stitch patterns 816, 818, the stitched contact strips 814 are stitched into the top layer 802 so as to span the separation in the x-direction between the PV strips 810 and the bottom layer conductive strips 812. Accordingly, when the top layer 802, active layer 804 and bottom layer 806 are laminated together, the stitched contact strips 814 are positioned in the top layer 802 so that left contact points 814A contact the TCO of corresponding PV strip 810 and right contact points 814B contact the top surface of the corresponding bottom layer conductive strip 812.

Both of stitch patterns 816, 818 include a pitch 826, where pitch 826 is defined as the distance in the y-direction from one left or right contact point 814A, 814B to the next left or right contact point 814A, 814B. The pitch 826 can be substantially constant, as in the stitch patterns 816, 818, or variable (not shown). In some examples, the pitch 826 is between 0.5 mm and 3 mm.

Both of stitch patterns 816, 818 also include a first lateral incursion and/or a second lateral incursion. The first lateral incursion is defined as the distance in the x-direction from the rightmost edge (generally corresponding to reference lines 820, 824) of an underlying PV strip 810 to left contact points 814A, while the second lateral incursion is defined as the distance in the x-direction from the rightmost edge of an underlying PV strip 810 to right contact points 814B. The first and/or second lateral incursions may be constant or variable. For instance, the stitch pattern 816 includes constant first and second lateral incursions, while the stitch pattern 818 includes a variable first later incursion and a constant second lateral incursion. In other words, the stitch pattern 818 variably encroaches over the underlying PV strip 810 along the length of the stitched contact strip 814 having stitch pattern 818.

In some examples, stitch pattern 818 functions as a power collection grid, despite being different in implementation from the power collection macro and nano grids described above with respect to FIGS. 3A-4C. In particular, the variable first lateral incursion of stitch pattern 818 permits the stitched contact strip 814 with stitch pattern 818 to collect power from the TCO of an underlying PV strip 810 at multiple locations across the width of the underlying PV strip 810, for reduced parasitic capacitance in the underlying PV strip 810.

Optionally, a ball or other enlarged portion of conductive material is formed at each contact point 814A, 814B to ensure good contact with the TCO of the corresponding PV strip 812 or the top surface of the corresponding bottom layer conductive strip. The ball or other enlarged portion can be formed in stitched contact strips 814 during or after the stitching of the stitched contact strips 814 into the top layer 802.

Alternately or additionally, if the stitched contact strips 814 are made from insulated wire, the insulation is stripped at least from the contact points 814A, 814B during or after the stitching of the stitched contact strips 814 into the top layer 802. In some embodiments, the insulation is left on the stitched contact strips 814 substantially everywhere except at the contact points 814A, 814B so as to prevent the stitched contact strips 814 from shorting to the substrate of the PV strips 810 where the stitched contact strips 814 cross over the edges of the PV strips 810.

Alternately or additionally, the stitched contact strips 814 are made from wire that is at least partially reflective of light. For instance, the stitched contact strips 814 can be made from wire that is polished or extruded to be at least partially reflective or from wire that includes a coating that is at least partially reflective of light. As such, the stitched contact strips 814 may be configured to reflect light onto PV strips 810.

Optionally, the diameter, conductivity, and/or electromigration properties of the stitched contact strips 814 are selected to ensure designed failure in the event of a shunting defect occurring at or in proximity of the stitched contact strip 814 contact location to the TCO of the underlying PV strip 810. Such designed failure in some examples minimizes functional and reliability impact of shunting defects and is described in greater detail in U.S. Provisional Application Ser. No. 61/022,240, filed Jan. 18, 2008 and entitled INTEGRATED DEFECT MANAGEMENT FOR A THIN-FILM PHOTOVOLTAIC SYSTEM.

V. Electronics

Figure 9:
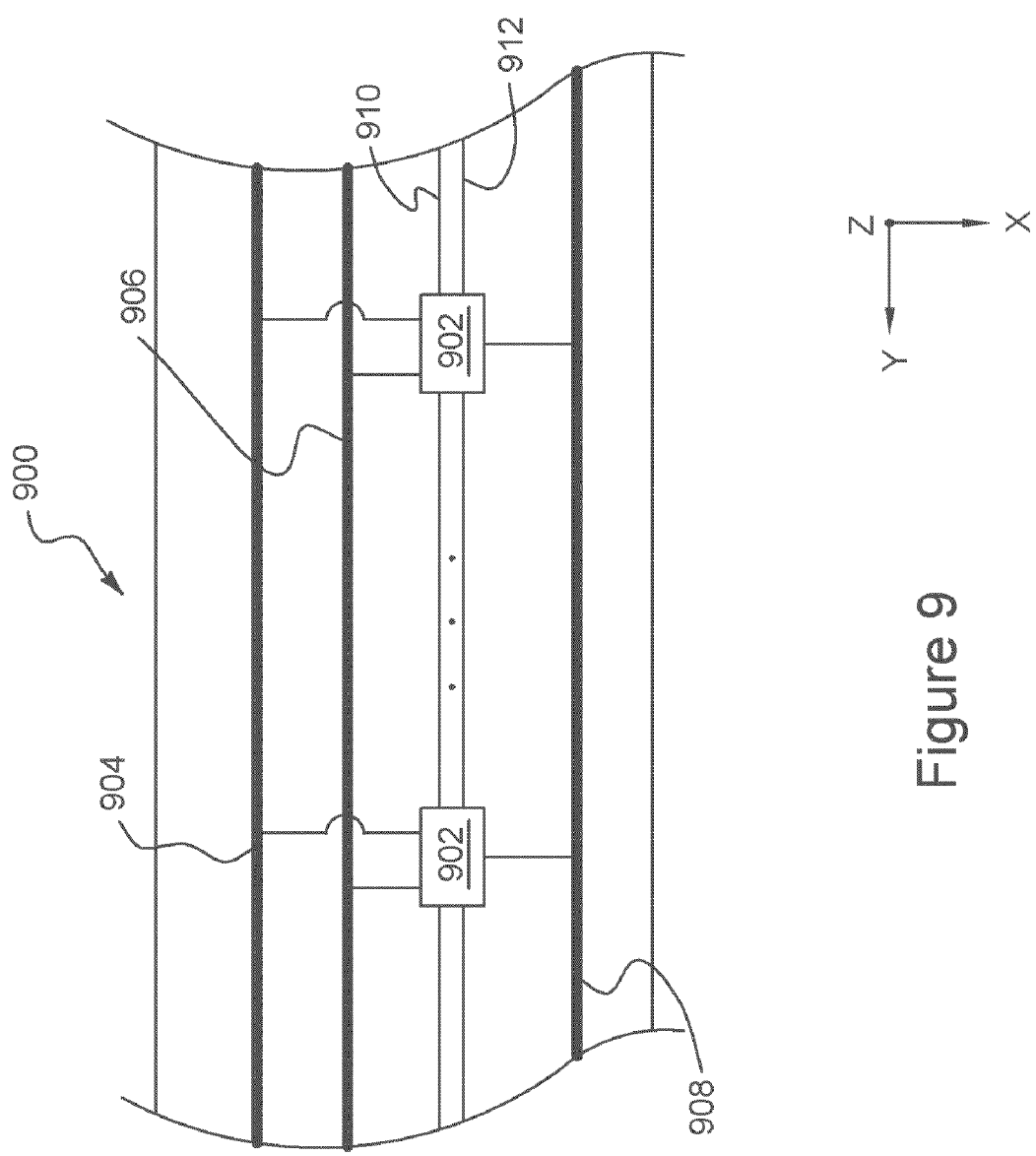
FIG. 9 depicts an example electronic circuit layer and power conversion circuits that can be implemented in the PV modules according to some embodiments.

Returning to FIGS. 1A-1D, some embodiments of the PV modules 100 described herein include an electronic circuit layer 142 and/or one or more power conversion circuits 144. FIG. 9 illustrates a block diagram of an example electronic circuit layer 900 and power conversion circuits 902 that may correspond to the electronic circuit layer 142 and power conversion circuits 144 of FIGS. 1A-1D.

In some embodiments, the electronic circuit layer 900 is a flexible circuit. As shown in FIG. 9, the electronic circuit layer 900 includes an input bus 904, current return bus 906 and conditioned output bus 908. Alternately or additionally, the electronic circuit layer further includes one or more digital control lines 910, 912.

The input bus 904 is configured to be connected to the last PV strip of a PV module in which the electronic circuit layer 900 is implemented. For instance, the input bus 904 in some embodiments is connected to the last PV strip 122D, e.g., through first vias 142A and/or power collection grid 120C, of PV module 100 of FIG. 1D. The input bus 904 is further configured to be connected to inputs of the power conversion circuits 902. Accordingly, the input bus 904 collects current from the series-connected PV strips of the PV module and distributes the current to the power conversion circuits 902.

The current return bus 906 is configured to be connected to the conductive backsheet of a PV module in which the electronic circuit layer 900 is implemented. For instance, the current return bus 906 in some embodiments is connected to the conductive backsheet 134, e.g., through second vias 142B and/or contact strip 140F, of the PV module 100 of FIG. 1D. The current return bus 906 is further configured to be connected to current return outputs of power conversion circuits 902. Accordingly, the current return bus 906 is part of the current return path for the series-connected PV strips of the PV module in which the electronic circuit layer 900 is implemented.

The conditioned output bus 908 is configured to be connected to the conditioned outputs of power conversion circuits 902. The conditioned output bus 908 collects the conditioned power generated by power conversion circuits 902 and carries the conditioned power to the end(s), e.g., the positive and/or negative y side, of the electronic circuit layer 900 and PV module.

As illustrated in FIG. 9, the digital control lines 910, 912 are differential digital control lines. In other embodiments, the digital control lines 910, 912 are implemented as a single-ended digital control line. The digital control lines 910, 912 can be used by a control module, e.g., processor, controller, microprocessor, microcontroller, or the like, to control operation of the power conversion circuits 902. One or more of the power conversion circuits 902 may include a control module and/or a discrete control module may be provided for the purpose of controlling the power conversion circuits 902 via digital control lines 910, 912.

In operation, the power generated by the PV module is collected on the input bus 904 and distributed to power conversion circuits 902, where the power conversion circuits 902 output conditioned power on the conditioned output bus 908 and return current through the current return bus 906 and conductive backsheet.

Generally, the power conversion circuits 902 are configured to generate conditioned power by converting a first voltage collectively generated by the PV strips of a PV module to a second voltage that is larger than the first voltage. The resulting conditioned power output of the power conversion circuits 902 therefore has a relatively lower current than the power generated by the PV strips, making it more suitable for transmission to a battery and/or a load without the need for large transmission wires or cables. In some embodiments, for example, the power conversion circuits 902 collectively convert 200 watts of direct current ("DC") electrical power at 8 volts and 25 amps to 200 watts DC at 48 volts and 4.2 amps. Alternately, the power conversion circuits 902 may collectively convert 200 watts DC at 8 volts and 25 amps to 200 watts DC at 35-60 volts and 5.7-3.3 amps. The specific voltage and amperage values for the input and conditioned power output discussed herein are provided by way of example only and should not be construed to limit the invention.

In some examples, one or more of the power conversion circuits 902 are redundant, such that not all of the power conversion circuits 902 are required during operation. Alternately or additionally, the current capacity of each of power conversion circuits 902 is at least 2 times a normal operating current. By implementing redundant power conversion circuits 902 having excess current capacity, a PV module in which the power conversion circuits 902 are implemented can continue operating without any effect on the power output on power supply 908 when one or more of the power conversion circuits 902 has failed or is switched off and/or when the PV module is exposed to illumination exceeding 100%, or the like.

In some embodiments, the power conversion circuits 902 are balanced using one or more of pulse-width modulated ("PWM") control, phasing of each power conversion circuit 902 relative to other power conversion circuits 902 and defect management.

Additional details regarding power conversion circuits according to some embodiments and other aspects of PV modules are disclosed in U.S. application Ser. No. 12/357,260, filed Jan. 21, 2009 and entitled REDUNDANT ELECTRICAL ARCHITECTURE FOR PHOTOVOLTAIC MODULES, U.S. Provisional Application Ser. No. 61/022,267, filed Jan. 18, 2008 and entitled A PHOTOVOLTAIC SYSTEM WITH EMBEDDED ELECTRONICS, U.S. Provisional Application Ser. No. 61/035,976, filed Mar. 12, 2008 and entitled A REDUNDANT SILICON SOLAR ARRAY, U.S. Provisional Application Ser. No. 61/042,629, filed Apr. 4, 2008 and entitled REDUNDANT ARRAY OF SOLAR, and U.S. Provisional Application Ser. No. 61/022,242, filed Jan. 18, 2008 and entitled OPERATING FEATURES FOR INTEGRATED PHOTOVOLTAIC SYSTEMS.

Returning to FIGS. 1A-1D, in some examples, the PV strips 102 collectively generate a voltage of 2 to 20 volts and a current that varies with illumination intensity, but that may be anywhere between 10-60 amps per lineal foot of PV module 100 in the y direction. The power conversion circuits 144 are configured to step up the voltage and step down the current to make the power supply more suitable for long-distance transmission.

Because the PV module 100 generates voltages that are relatively low (e.g., 2 to 20 volts), the conductive backsheet 134 can include metal that is an exposed or minimally insulated electrical ground, rather than being heavily insulated. In contrast, conventional PV modules can generate voltages up to 600 volts, requiring an enclosed current return path. The ability to implement an exposed or minimally insulated conductive backsheet 134 in PV module 100 allows the conductive backsheet 134 to spread and dissipate thermal energy outside the PV module 100 more efficiently than PV modules that have insulated current return paths, thereby providing a relative improvement in thermal performance for the PV module 100 compared to some PV modules.

As shown in FIGS. 1A-1D, the power conversion circuits 144 are attached along one edge of the PV module 100 (e.g., within edge cap 106B). Alternately or additionally, the power conversion circuits 144 can be attached to other locations of the PV module 100. For examples, FIGS. 10A-10C illustrate different configurations of power conversion circuits. In particular, FIG. 10A illustrates a PV module 1000A having power conversion circuits 1002 arranged along one edge of the PV module 1000A. The power output from the PV module 1000A is designated at 1004 and the current return path is designated at 1006.

FIG. 10B illustrates a PV module 1000B having power conversion circuits 1008 arranged along both edges of the PV module 1000B. The power output from PV module 1000B is designated at 1010A and 1010B and two current return paths are designated 1012A and 1012B.

FIG. 10C illustrates a PV module 1000C having power conversion circuits 1014 arranged along the center of PV module 1000C. The power output from PV module 1000C is designated at 1016 and two current return paths are designated at 1018A and 1018B.

VI. Mounting PV Modules

Turning next to FIGS. 11A-11F, various mounting configurations are disclosed for PV modules having shaped interconnecting regions including concentrators. FIG. 11A illustrates a wall-mounted horizontal configuration for a PV module 1100A including a plurality of concentrators 1102 (only one is shown in FIG. 11A) and PV regions 1104. In this configuration, the PV module 1100A is mounted to a wall 1106 or other framing structure including one or more shaped supports 1108 extending horizontally across the wall 1106. The shaped supports 1108 are complementary in shape to the concentrators 1102 and the PV module 1100A is mounted to the wall 1106 such that the concentrators 1108 align with the shaped supports 1108 so as to also extend horizontally. A plurality of fasteners 1110 (only one is shown in FIG. 11A) are inserted through the concentrators 1102 into the shaped supports 1108 to secure the PV module 1100A to the wall 1106. In this and other configurations, the fasteners 1110 include one or more of metal or plastic nails, plastic-coated nails, rubber-coated nails, nails with sealing heads, metal or insulating-coated screws, screws with sealing heads, clips, or the like or any combination thereof.

In this and other configurations, the shaped supports 1108 can be discrete or continuous along the length of the PV module 1100A. Alternately or additionally, rather than being directly mounted to a wall 1106 or other substantially continuous surface, the PV module 1100A can be mounted to a framing structure made up of components, such as studs, that are discrete along the length and/or width of the PV module 1100A, that permit air to circulate along the back side of the PV module 1100A for PV module 1100A cooling and/or that facilitate easy installation, serviceability, cleaning, and/or other maintenance. Alternately or additionally to fasteners 1110, adhesive can be provided between the concentrators 1102 and shaped supports 1108 and/or between the PV module 1100A and the wall 1106 or other framing structure so as to secure the PV module 1100A to the wall 1106 or other framing structure.

FIG. 11B illustrates another wall-mounted horizontal configuration for a PV module 1100B that is similar to the wall-mounted horizontal configuration of FIG. 11A. In particular, the PV module 1100B includes a plurality of concentrators 1112 (only one is shown in FIG. 11B) and PV regions 1114. The PV module 1100B is mounted to a wall 1116 or other framing structure including one or more shaped supports 1118 extending horizontally across the wall 1116. In contrast to the PV module 1100A of FIG. 11A, the PV module 1100B includes a plurality of slots 1120 formed in the concentrators 1112. The slots 1120 are configured to receive clips 1122 or other fasteners to secure the PV module 1100B to the wall 1116. In some embodiments, the slots 1120 are periodically spaced in the concentrators 1112. Optionally, unused clips 1122 can be flattened, e.g., hammered, flush against the shaped support 1118 prior to or after installation of the PV module 1100B. Alternately or additionally, sealant is placed over each slot 1120 after installation.

FIG. 11C illustrates a wall-mounted vertical configuration for a PV module 1100C including a plurality of concentrators 1124 and PV regions 1126. The configuration of FIG. 11C is vertical insofar as the PV module 1100C is mounted such that concentrators 1124 and PV regions 1126 extend substantially vertically. The upper portion of FIG. 11C includes a front view of the PV module 1100C while the lower portion of FIG. 11C shows a cross-sectional view through section A-A identified in the upper portion of FIG. 11C. As best seen in section A-A, the PV module 1100C is mounted to a framing structure 1128 including shaped supports 1130 extending vertically. A plurality of fasteners 1132 (only one is shown in FIG. 11C) are inserted through the concentrators 1124 into the shaped supports 1130 to secure the PV module 1100C to the framing structure 1128.

FIG. 11D illustrates a roof-mounted configuration for a PV module 1100D including a plurality of concentrators 1134 and PV regions 1136. In this configuration, the PV module 1100D is mounted to a framing structure 1138 on a sloped roof, the framing structure 1138 including one or more shaped supports 1140 extending up and down the sloped roof. The PV module 1100D is mounted to the framing structure 1138 such that the concentrators 1134 also extend up and down the sloped roof. A plurality of fasteners 1142 are inserted through the concentrators 1124 into the shaped supports 1140 to secure the PV module 1100D to the framing structure 1138.

FIG. 11E illustrates another roof-mounted configuration for a PV module 1100E including a plurality of concentrators 1144 and PV regions 1146. In this configuration, the PV module 1100E is mounted directly to a sloped roof 1148 by applying adhesive 1150 between substantially planar regions (e.g., PV regions 1146) of the PV module 1100E and the sloped roof 1148. Areas under the concentrators 1144 are left open for air to circulate and provide passive cooling for the PV module 1100E. In particular, heat generated in the PV regions 1146 during normal operation is at least partially transferred to the concentrators 1144 via thermal conduction and then transferred away from the concentrators 1144 by the air circulating beneath the concentrators 1144.

FIG. 11F illustrates yet another roof-mounted configuration for a PV module 1100D including a plurality of concentrators 1152 and PV regions 1154. In this configuration, the PV module 1100F is mounted to a framing structure 1156 on a sloped roof, the framing structure 1156 including one or more shaped supports 1158 extending horizontally. The PV module 1100F is mounted to the framing structure 1100F such that the concentrators 1152 also extend horizontally. A plurality of fasteners 1160 are inserted through the concentrators 1152 into the shaped supports 1158 to secure the PV module 1100F to the framing structure 1156.

Turning next to FIG. 12A, an example PV module 1200 having PV regions 1202 and interconnecting regions 1204 is shown in which a plurality of fastener regions 1206 are formed in the interconnecting regions 1204 for receiving fasteners. As shown, the fastener regions 1206 are formed at regular intervals along the length of each interconnecting region. Alternately or additionally, the fastener regions 1206 are visible to the naked eye.

FIG. 12B illustrates a cross-sectional view through a fastener region 1206 of the PV module 1200. As best seen in FIG. 12B, the PV module 1200 further includes a substantially transparent film 1208, a plurality of PV strips 1210 in the PV regions 1202, a plurality of bottom layer conductive strips 1212 (only one is shown) in the interconnecting regions 1204, a conductive backsheet 1214, and various adhesive layers 1216A, 1216B, 1216C.

Generally, the fastener regions 1206 include one or more through holes 1218A, 1218B formed in one or more conductive layers of the PV module 1200. In particular, in the illustrated embodiment, the fastener region 1206 of FIG. 12B includes a through hole 1218A formed in the bottom layer conductive strip 1212 and a through hole 1218B formed in the conductive backsheet 1214. Alternately or additionally, through holes can be formed in top layer conductive strips to form fastener regions in PV modules that have top layer conductive strips.

As shown in FIG. 12B, the through holes 1218A, 1218B are aligned to each other in the z-direction. Optionally, the through holes 1218A, 1218B are filled with adhesive from one or more of the adjacent adhesive layers 1216A, 1216B, 1216C or with other fillers. Alternately or additionally, the adhesive or other fillers are electrically insulating.

In some embodiments, the size (e.g., the diameter) of the through holes 1218A, 1218B is larger than the size (e.g., the diameter) of a corresponding fastener 1220 configured to be inserted through the fastening regions 1206. For instance, in the example of FIG. 12B, the fastener 1220 includes a substantially cylindrical shaft 1222 that is smaller in diameter than the diameter 1224 of through holes 1218A, 1218B. The difference in sizes of the through holes 1218A, 1218B and shaft 1222 of fastener 1220 is configured to substantially reduce the likelihood of the shaft 1222 shorting to the bottom layer conductive strip 1212 or conductive backsheet 1214.

The fasteners 1220 implemented according to some embodiments include a head 1226 with sealing gasket 1228. Alternately or additionally, a sealant 1230 can be applied to the substantially transparent film 1208 in the fastener region 1206.

In operation, the PV module 1200 can be secured to a structure by inserting fasteners 1220 through fastener regions 1206. In particular, after applying sealant 1230 to the fastener regions 1206, the fasteners 1220 can be hammered through or otherwise inserted through fastener regions 1206 such that the shaft 1222 of each such fastener 1220 penetrates through substantially transparent film 1208, adhesive layers 1216A and 1216B, the through hole 1218A of bottom layer conductive strip, adhesive layer 1216C, the through hole 1218B of conductive backsheet 1214, and into an underlying support structure.

In some embodiments, the through holes 1218A, 1218B are formed in the bottom layer conductive strips 1212 and/or conductive backsheet 1214 using stamping, cutting, drilling, or other suitable method(s). Alternately or additionally, the bottom layer conductive strips 1212 are cut from a continuous sheet of material, and the through holes 1218A can be formed in the continuous sheet of material prior to cutting into the bottom layer conductive strips 1212.

As already mentioned above with respect to FIGS. 11A-11F, various mounting configurations can be employed to passively cool the PV modules 1100A-1100F. FIG. 13 provides additional passive cooling details regarding a mounting configuration that may correspond to the PV module 1100E and mounting configuration of FIG. 11E.

In particular, FIG. 13 discloses a PV module 1300 having a plurality of concentrators 1302 (only one is shown) and a plurality of PV regions (not shown). The PV module 1300 is mounted to a sloped roof 1304. A vented ridge cap 1306 and flashing 1308 are provided in some embodiments to allow the ends of the concentrators 1302 to remain open while substantially preventing the ingress of water under the PV module 1300.

In operation, radiant energy from the sun is absorbed by the PV regions and is at least partially transferred via thermal conduction to the concentrators 1302. Air under the concentrators 1302 is heated by convection and circulates upwards towards the vented ridge cap 1306, eventually forcing heated air out through the vented ridge cap 1306 as represented by the arrow 1310, and drawing un-heated air under the concentrators 1302 near the flashing 1308 as represented by arrow 1312. Alternately or additionally, the heated air 1310 can be collected and used by a heating and ventilation system to heat a house or other building to which the sloped roof 1304 belongs.

Returning to FIGS. 11A-11F, some embodiments disclosed herein provide load support for installing and maintaining the PV modules 1100A-1100F. For instance, in the wall mounted configurations of FIGS. 11A-11C, a ladder can be leaned against the PV modules 1100A-1100C so as to rest against and therefore load one or more of the concentrators 1102, 1112, 1124. The shaped supports 1108, 1118, 1130 and concentrators 1102, 1112, 1124 provide support for the load of the ladder.

Alternately or additionally, in the example of FIGS. 11D and 11F, an individual could attempt to walk on or otherwise put his/her weight on the concentrators 1134, 1152 of PV modules 1100D, 1100F, which concentrators 1134, 1152 are supported by shaped supports 1140, 1158. Alternately or additionally, a plank or board could be laid across the concentrators 1134, 1152 to support the individual's weight.

In the example of FIG. 11E, an individual could put his/her weight on the PV regions 1146 which are directly attached to the sloped roof 1148.

Alternately or additionally, in any of the embodiments of FIGS. 11A-11F, a support device 1400 can be implemented such as depicted in FIG. 14. The support device 1400 is illustrated in the configuration of FIG. 11D using the same reference numbers as FIG. 11D where similar components are indicated. It will be appreciated, however, that the support device 1400 can be implemented in any of the configurations of FIGS. 11A-11F and/or in other configurations.

As shown in FIG. 14, the support device 1400 includes a plurality of cutouts 1402. The cutouts 1402 are complementary in shape and spacing to the concentrators 1144 so as to partially receive concentrators 1144. The cutouts 1402 in some examples only partially receive concentrators 1144 so that the bottom of support device 1400 remains a distance 1404 away from PV regions 1146 to thereby protect the PV regions 1146 from loading damage during installation and/or maintenance of PV module 1100D.

Optionally, the cutouts 1402 can be partially or completely coated with rubber or other protective coating to protect the concentrators 1144 from being damaged when a load is applied to the support device 1400. Alternately or additionally, the support device 1400 can be permanently installed with the PV module 1100D or temporarily implemented during installation and/or maintenance of the PV module 1100D.

Turning next to FIGS. 15A-15C, a PV module 1500 is disclosed that includes a plurality of discrete straps 1502 to support cross-directional loads on the PV module 1500. FIG. 15A illustrates an perspective view of the PV module 1500, FIG. 15B illustrates an upside-down cross-sectional view of the PV module 1500 across the width of the PV module 1500 and length of a strap 1502, and FIG. 15C illustrate a cross-sectional view of the PV module 1500 across the width of the strap 1502 of FIG. 15B.

As shown in FIG. 15B, the PV module 1500 includes a plurality of edge caps 1504A, 1504B. In some examples, an electronic circuit layer and/or power conversion circuits are housed within edge cap 1504B.

In some examples, the straps 1502 are configured to secure the PV module 1500 to a framing structure. For example, as best seen in FIG. 15B, the strap 1502 includes hooked ends 1506 that are configured to removably engage a framing structure to which the PV module 1500 is attached.

Alternately or additionally, the straps 1502 can include one or more rib structures to stiffen the straps 1502 (and consequently the PV module) in the x-direction. For instance, as best seen in FIG. 15C, the strap 1502 includes two rib structures 1508. Alternately or additionally, each strap 1502 can include more or less than two rib structures 1508.

The straps 1502 are spaced at periodic or random intervals along the length of the PV module 1500 and, as previously indicated, can be used to secure the PV module 1500 to a framing structure. Alternately or additionally, the straps 1502 elevate the PV module 1500 above the framing structure. Accordingly, it will be appreciated, with the benefit of the present disclosure, that the spacing of the straps 1502 and/or the elevation of the PV module 1500 above the framing structure allow for air circulation along a corresponding conductive backsheet of the PV module 1500 for PV module 1500 cooling in some embodiments.

VII. Concentrators

As already explained above, embodiments of the invention include PV modules having shaped interconnecting regions that are concentrators in some embodiments. Generally, the concentrators are configured to reflect and concentrate light onto adjacent PV regions of the PV modules. The width (e.g., at the base of each concentrator), height, shape, spacing and/or various other aspects of the concentrators can be varied according to a desired application and/or can be selected to optimize the output of the PV modules and may depend on one or more factors including an installation angle and/or installation latitude at an installation site. In these and other regards, the concentrators disclosed herein are similar to reflective louvers described in U.S. patent application Ser. No. 12/357,277, entitled "Detachable Louver System," filed Jan. 21, 2009, which application is herein incorporated by reference in its entirety. Although the application Ser. No. 12/357,277 discusses louvers, it will be appreciated that many or all of the principles applied to the louvers can be analogously applied to the concentrators disclosed herein.

In some embodiments, concentrators are formed from corresponding interconnecting regions by stamping or other methods section-by-section along the length of the PV module. Alternately or additionally, concentrators are formed in roll-to-roll operations from a sheet of PV module material prior to cutting the sheet of PV module material into discrete PV modules. Alternately or additionally, the PV modules can be shipped flat or in rolls to an installation site, whereupon concentrators are formed at the installation site prior to installation.

It will be appreciated, with the benefit of the present disclosure, that concentrators provide bending stiffness to PV modules in which the concentrators are implemented. In some embodiments, the bending stiffness provided by the concentrators is sufficient to permit PV modules to be supported by cross-direction support pieces (e.g., support pieces that are aligned substantially normal to the length of the concentrators) that are spaced on one foot to six foot centers and/or that support nominal live loadings such as ice, rain and snow roof loadings, wind loadings, and the like or any combination thereof.

Figures 16A, 16B:
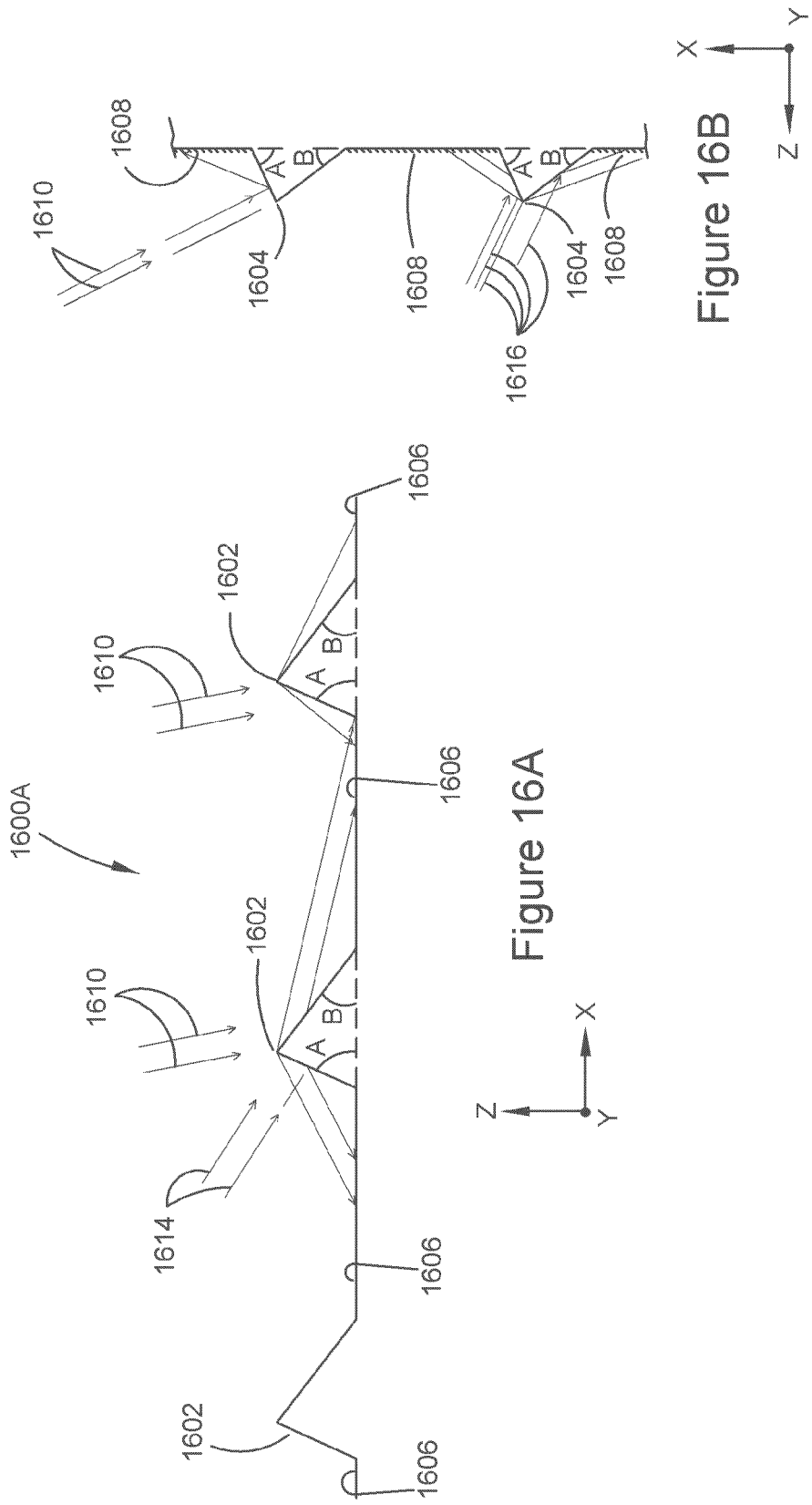
FIGS. 16A-16B depict incoming summer and winter light rays for static horizontally and vertically oriented PV modules with concentrators.

With additional reference to FIGS. 16A and 16B, various details regarding PV modules 1600A and 1600B having concentrators 1602, 1604 and PV regions 1606, 1608 disclosed. FIG. 16A depicts the PV module 1600A in a static horizontal orientation and FIG. 16B depicts the PV module 1600B in a static vertical orientation. Optionally, the concentrators 1602, 1604 are aligned to the sun's relative motion through the sky. That is, the concentrators 1602, 1604 may generally be aligned east to west.

Alternately or additionally, the concentrators 1602, 1604 can be aligned perpendicular to the sun's relative motion through the sky, or generally north to south for the PV module 1600A or vertically for the PV module 1600B. In the case of PV modules having concentrators aligned perpendicular to the sun's relative motion through the sky, the PV modules can be very efficient over a 3-7 hour period centered on mid-day, depending on the latitude of the installation site and the season of the year. For concentrators having a symmetric cross-sectional shape of a triangle with 45 degree angles at its base, shading losses may be high in the early morning and evening, and one face of the concentrator light may be lost, e.g., not reflected onto an adjacent PV region, over substantial morning and afternoon hours. Nevertheless, material cost and installation savings may result from PV module configurations with the concentrators aligned perpendicular to the sun's relative motion.

Returning to FIGS. 16A and 16B, the difference between incoming light rays in the summer versus the winter time for a relatively high latitude installation site are illustrated. In particular, incoming summer rays 1610, 1612 come from more directly overhead than incoming winter rays 1614, 1616.

In the examples of FIGS. 16A and 16B, each of the concentrators 1602, 1604 has a cross-sectional shape that is an asymmetrical triangle characterized by the angles A and B. In some embodiments, the angles A and B are selected such that at the middle of summer, incoming summer rays 1610 incident on the concentrators 1602 are reflected to the two PV regions 1606 adjacent to each concentrator 1602 with relatively uniform distribution on the PV region 1606 immediately to the right of the concentrator 1602 and more concentrated light on the PV region 1606 immediately to the left of the concentrator 1602. Alternately or additionally, the angle B is selected so as to substantially avoid shading any portion of the PV region 1606 immediately to the right of each concentrator 1602.

In the example of FIG. 16B, the angles A and B can be selected such that at the middle of summer, incoming winter rays 1616 incident on the concentrators 1604 are reflected to the two PV regions 1608 adjacent to each concentrator 1604. Alternately or additionally, the angle B is selected so as to substantially avoid shading any portion of the PV region 1608 immediately below each concentrator 1604.

VIII. Alternate Embodiments

Embodiments disclosed herein include PV modules having PV strips of substantially equal width. Alternately or additionally, the PV modules can have PV strips of unequal widths. For example, FIG. 17 depicts a PV module 1700 having PV strips 1702A-1702C of unequal widths separated by interconnecting regions 1704A, 1704B.

As shown, PV strip 1702A has a width 1706, PV strip 1702B has a width 1708, and PV strip 1702C has a width 1710. The widths 1706, 1708, 1710 may all be unequal to each other, or some of the widths 1706, 1708, 1710 may be substantially equal to one or more of the widths 1706, 1708, 1710 but not to others.

In some embodiments, the widths 1706, 1708, 1710 of the PV strips 1702A, 1702B, 1702C is selected so as to equalize some aspect of the performance of the PV strips 1702A, 1702B, 1702C. For instance, the widths 1706, 1710 of the PV strips 1702A, 1702C may be selected to be larger than the width 1708 of the PV strip 1702B so that the current contribution from all the PV strips 1702A-1702C is substantially equal under uniform lighting conditions.

Optionally, the PV strips 1702A-1702C can be cut from a continuous PV sheet. In this and other examples, aspects of the performance of the PV sheet can be measured in particular regions prior to cutting the PV sheet into PV strips 1702A-1702C. Such measurements may indicate that certain areas of the PV sheet perform better than others. Accordingly, in this example, the PV sheet is cut into PV strips 1702A-1702C of unequal widths 1706, 1708, 1710 so as to substantially equalize the current contribution from each PV strip 1702A-1702C.

Returning to FIGS. 1A-1D, some embodiments include PV modules 100 having an electronic circuit layer 142 and power conversion circuits 144 enclosed within an edge cap 106B that is continuous along the length of the PV module 100. In this and other embodiments, the edge cap 106B may be flexible such that the PV module 100 can be manufactured and shipped in a roll form. Accordingly, the electronic circuit layer 142, power conversion circuits 144 and edge cap 106B can be laminated or otherwise attached to the PV module 100 during manufacturing.

Figure 18C:
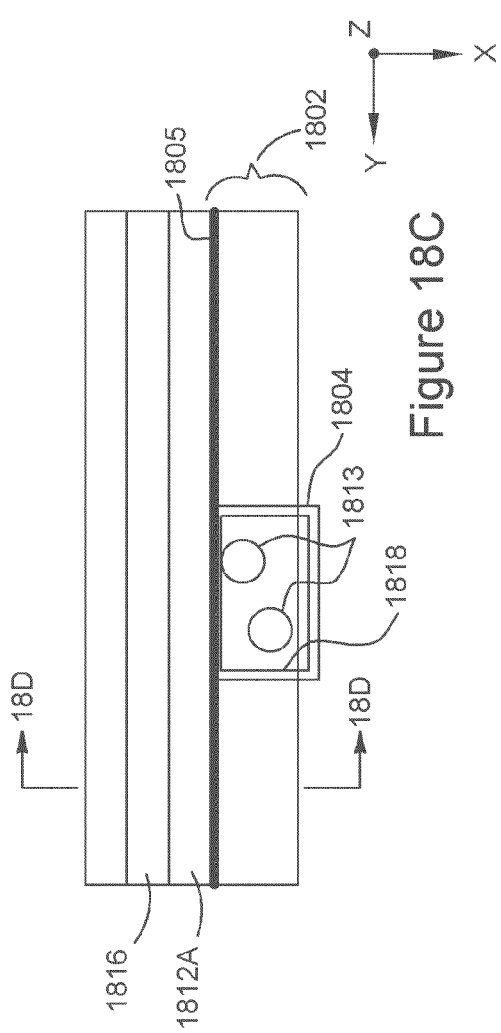
Figure 18D:
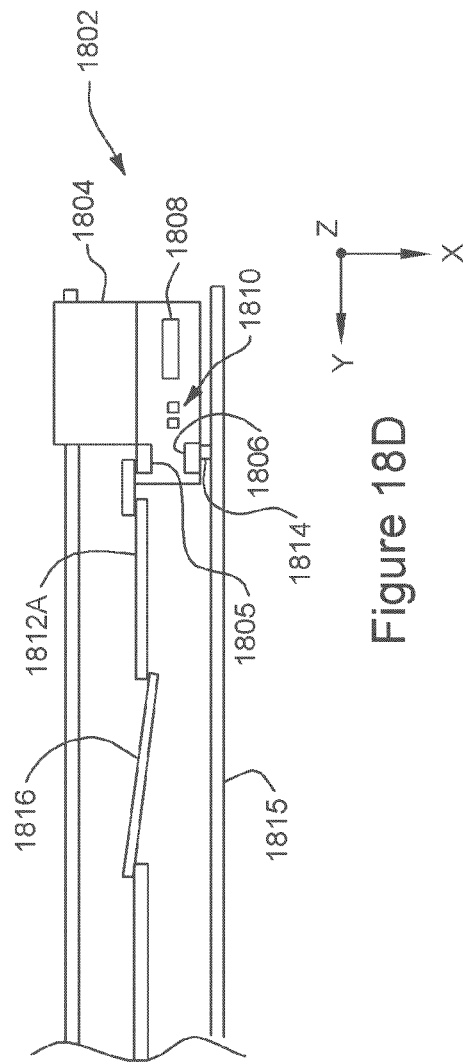

Alternately or additionally, some embodiments include PV modules 1800 having an at least partially exposed electronic circuit layer 1802 and/or power conversion circuits in discrete housings 1804 as shown in the top view and side view of PV module 1800 in FIGS. 18A and 18B, respectively. FIG. 18C illustrates a close-up top view of a portion of the PV module 1800 in the vicinity of a discrete housing 1804. FIG. 18D is a cross-sectional view through the portion of the PV module 1800 depicted in FIG. 18C.

In the illustrated example of FIGS. 18C-18D, the electronic circuit layer 1802 includes an input bus 1805, a current return bus 1806, a conditioned output bus 1808 and one or more digital control lines 1810. The input bus 1805 is connected between a last PV strip 1812A and inputs of one or more power conversion circuits 1813 housed within housing 1804. The power conversion circuits 1813 have current return outputs connected to the current return bus 1806 and conditioned outputs connected to conditioned output bus 1808. The current return bus 1806 is connected through contact strip 1814 to a conductive backsheet 1815 of the PV module 1800 to form a current return path. Alternately or additionally, the power conversion circuits 1813 use a ground plane of the electronic circuit layer 1802 for thermal heat dissipation.

In some embodiments, the housings 1804 containing power conversion circuits 1813 are attached to the PV module 1800 at an installation site and/or after interconnecting regions 1816 of the PV module have been shaped to form concentrators. For instance, the housings 1804 can be configured to be clipped, screwed, wired, or otherwise attached to the electronic circuit layer 1802, with the power conversion circuits 1813 being positioned within the housings 1804 to electrically connect to the input bus 1805, current return bus 1806, conditioned output bus 1808 and digital control lines 1810 when the housing 1804 has been secured to the electronic circuit layer 1802.

In some embodiments, prior to attaching the housings 1804 to the PV module 1800, at least partial perforations can be formed in the electronic circuit layer 1802 at periodic or other intervals that permit the power conversion circuits 1813 to connect to the input bus 1805, current return bus 1806, conditioned output bus 1808 and digital control lines 1810. In some examples, the perforations are formed in the electronic circuit layer 1802 at a manufacturing facility and/or are used to electrically interconnect to the PV module 1800 to test the PV module 1800 prior to shipment from the manufacturing facility.

Optionally, the housings 1804 are substantially self-sealing to at least partially prevent water penetration into the housings 1804. For instance, a sealing material 1818 such as silicon sealant or other suitable material(s) can be disposed around at least a portion of the perimeter of the housing 1804 that is adjacent to the electronic circuit layer 1802 so as to form a seal after the housing 1804 has been attached to the electronic circuit layer 1802.

Alternately or additionally, one or more of the housings 1804 includes a control module and/or a light emitting diode ("LED") configured to report the status of the power conversion circuits 1813. The LED can implement one or more lighting sequences to identify the power conversion circuits 1813 as being active, non-active, and/or to report errors.

Alternately or additionally, and as best seen in FIGS. 18A and 18B, the PV module 1800 includes one or more end connectors 1820A, 1820B configured to interconnect the PV module 1800 to one or more additional PV modules 1800 and/or a power system by interconnecting to the conditioned output bus 1808 with a second connector attached to the PV module 1800 base (e.g., current return bus 1806). Adhesive or other sealant can be applied between end connectors 1820A, 1820B of interconnected PV modules 1800 to provide a water tight barrier where end connectors 1820A, 1820B are connected to each other on interconnected PV modules 1800.

IX. Methods of Manufacturing

Figure 19A:
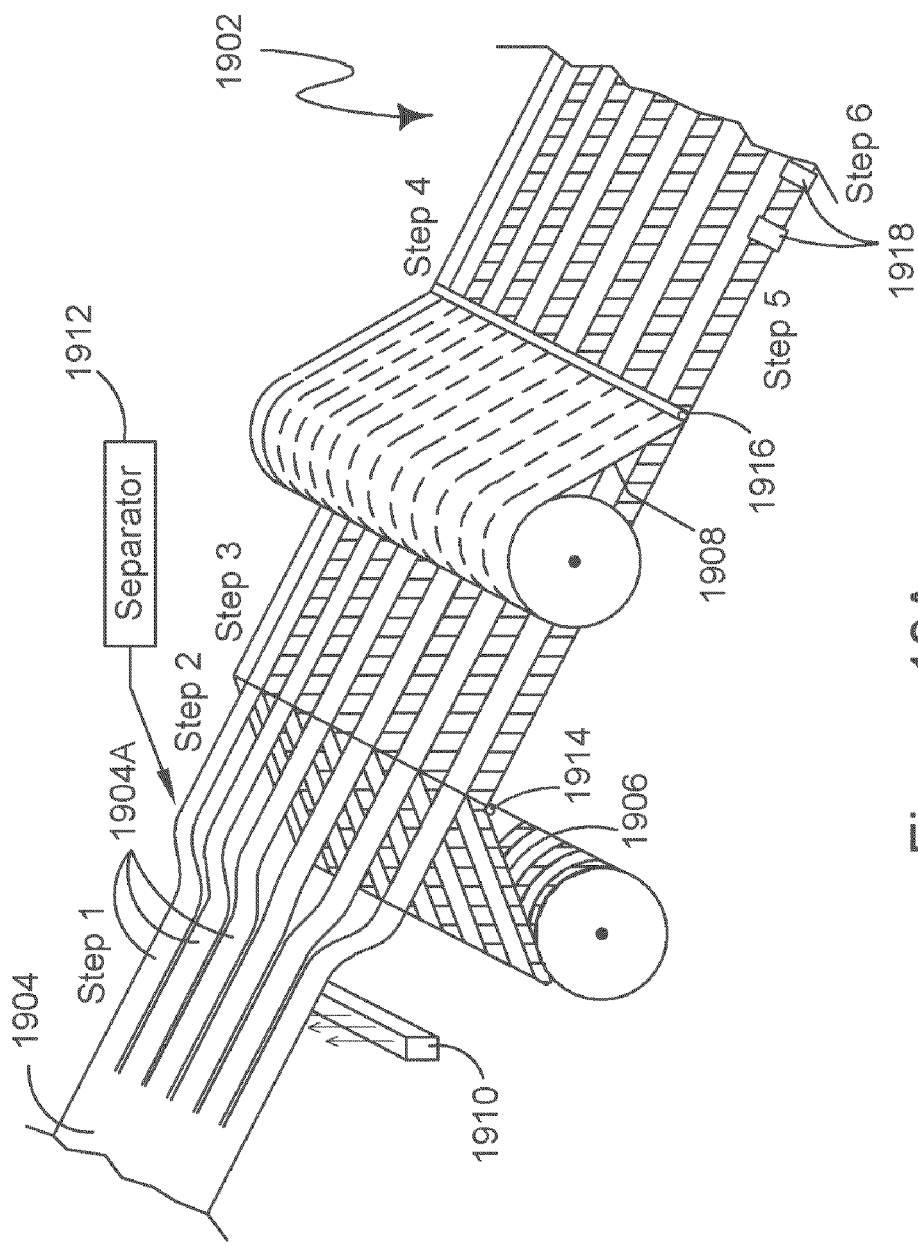
FIGS. 19A-19B depicts methods and systems for roll-forming PV modules from continuous sheets of PV material.
Figure 19B:
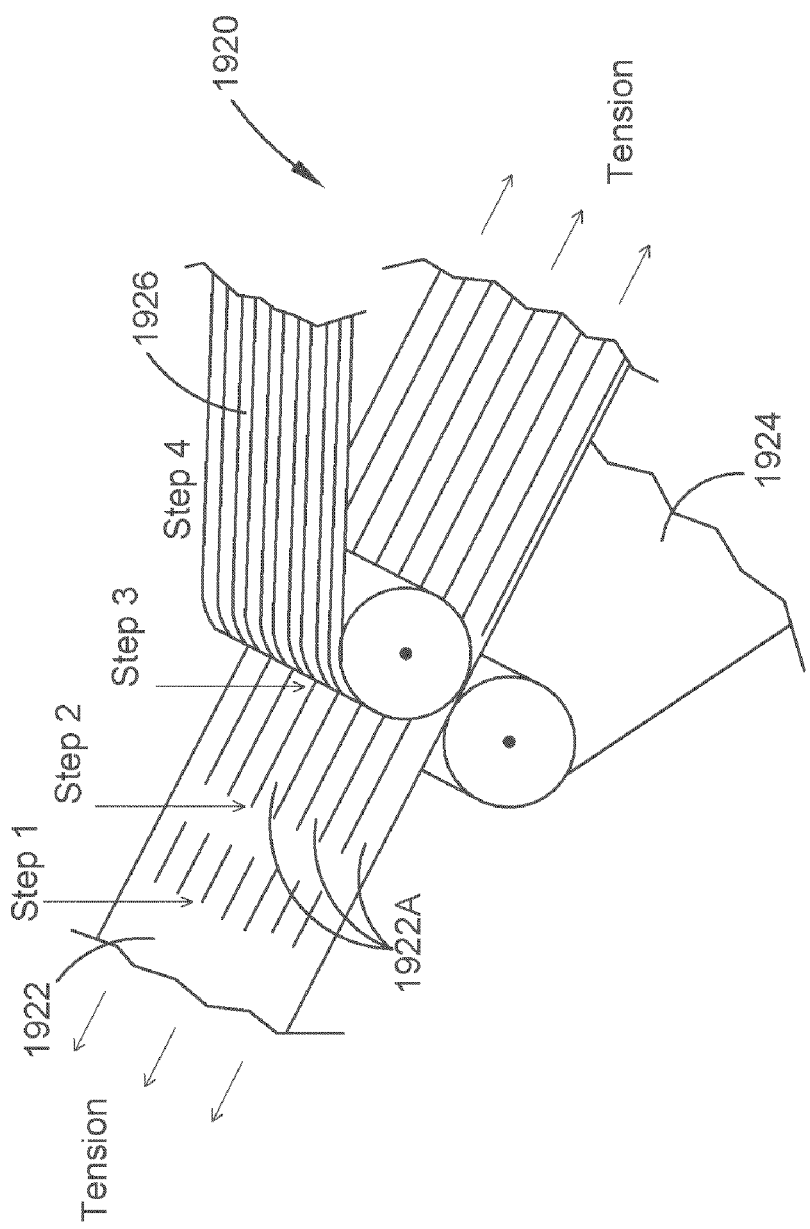

With additional reference to FIGS. 19A and 19B, various systems and methods of forming PV modules according to some embodiments are disclosed. In particular, FIG. 19A discloses a roll-forming system and method for forming PV module material 1902 from a continuous sheet 1904 of thin-film PV material ("PV sheet 1904"), a roll of bottom layer material 1906 and a roll of top layer material 1908. The bottom layer 1906 can include, for example, a conductive backsheet, bottom layer conductive strips, and/or one or more adhesive layers while the top layer 1908 can include, for example, a substantially transparent film, a power collection grid, top layer conductive strips, and/or one or more adhesive layers. The system of FIG. 19A includes a slitting system 1910, a separator 1912 and one or more laminators 1914, 1916.

At step 1, the PV sheet 1904 is cut by the slitting system 1910 into a plurality of PV strips 1904A. The slitting system includes a laser slitting system, mechanical slitting system or other appropriate slitting system. Alternately or additionally, step 1 can be omitted by feeding pre-cut PV strips 1904A into the system of FIG. 19A.

At step 2, the PV strips 1904A are arranged to be spaced apart from and substantially parallel to each other by the separator 1912. Step 2 includes the separator 1912 separating the PV strips 1904A from each other in some examples. At step 3, the bottom layer 1906 is laminated to a bottom surface of the PV strips 1904A by laminator 1914.

At step 4, the top layer 1908 is laminated to a top surface of the PV strips 1904A by laminator 1916 to produce PV module material 1902 which can be cut to any desired length to form PV modules.

In some examples, the bottom layer 1906 is aligned beneath the PV strips 1904A such that each of the bottom layer conductive strips in the bottom layer 1906 is electrically connected to the substrate of an adjacent PV strip 1904A during step 3. Further, the top layer 1908 is aligned in some examples above the PV strips 1904A such that each of the top layer conductive strips in the top layer 1908 is electrically connected to the TCO of an adjacent PV strip 1904A either directly or through a power collection grid during step 4. Alternately or additionally, the alignment of the bottom and top layers 1906, 1908 is such that laminating the bottom layer 1906 to the bottom of the PV strips 1904A and laminating the top layer 1908 to the top of the PV strips 1904A includes serially and redundantly interconnecting the PV strips 1908A together by connecting each of the PV strips 1904A to adjacent bottom and top layer conductive strips.

Optionally, at step 5, a polyimide strip is applied along the edge of the PV module material 1902. Alternately or additionally, at step 6, one or more power conversion circuits 1918 are attached to the edge of the PV module material 1902.

FIG. 19B discloses another roll-forming system and method for forming PV module material 1920 from a continuous sheet 1922 of thin-film PV material ("PV sheet 1922"), a roll of bottom layer material 1924 and a roll of top layer material 1926. The bottom layer 1924 can include, for instance, a conductive backsheet, bottom layer conductive strips, and/or one or more adhesive layers while the top layer 1926 can include, for instance, a substantially transparent film, a power collection grid, top layer conductive strips, and/or one or more adhesive layers. Although not shown, the system of FIG. 19B can include, for example, an ablating system, a slitting system, a dispensing and curing system, a separator and one or more laminators.

At step 1, TCO-free regions are formed in the PV sheet 1922 by ablating the TCO from the PV sheet in various regions. Step 1 is similar in some embodiments to stage 2 described above with respect to FIG. 6.

At step 2, the PV sheet 1922 is cut along the TCO-free regions, e.g., by a slitting system, to form a plurality of PV strips 1922A. Step 2 is similar in some embodiments to stage 3 described above with respect to FIG. 6.

At step 3 a protection layer is applied to the TCO-free regions and cured, e.g., by a dispensing and curing system. Alternately or additionally, the PV strips 1922A are arranged to be spaced apart from and substantially parallel to each other by a separator. Step 3 is similar in some embodiments to stage 4 described above with respect to FIG. 6.

At step 4, the bottom layer 1924 and top layer 1926 are laminated to, respectively, a bottom surface and a top surface of the PV strips 1922A to produce PV module material 1920 which can be cut to any desired length to form PV modules. Similar to the example of FIG. 19A, in the example of FIG. 19B, the alignment of the bottom and top layers 1924, 1926 is such that laminating the bottom layer 1924 to the bottom of the PV strips 1922A and laminating the top layer 1926 to the top of the PV strips 1922A includes serially and redundantly interconnecting the PV strips 1922A together by connecting each of the PV strips 1922A to adjacent bottom and top layer conductive strips.

One skilled in the art will appreciate that, for the methods described with respect to FIGS. 19A and 19B and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Further, the methods of FIGS. 19A and 19B can alternately or additionally be combined with other methods and/or steps described herein, such as methods of forming the top layer, bottom layer, power collection macro and/or nano grids as described above with respect to FIGS. 3A-4B, through holes in one or more of the bottom layer 1906, 1924 or top layer 1908, 1926 for forming fastener regions, mounting resulting PV modules to a structure, and the like or any combination thereof.

As mentioned above, the methods of FIGS. 19A and 19B produce PV module material 1902, 1920 that can be cut to any desired length to form PV modules. For example, FIG. 20A depicts a portion of a sheet of PV module material 2000 that may be up to 2000 feet or more in length. As shown in FIG. 20A, the sheet of PV module material 200 can be transversely cut at locations 2002 to form a plurality of discrete PV modules 2004, each PV module 2004 having, among other things, one or more electronic circuit layers 2005 disposed along one or both longitudinal edges of the sheet of PV module material 2000 and a plurality of redundant power conversion circuits 2006 attached to the electronic circuit layers 2005.

Optionally, the sheet of PV module material 2000 may be tested prior to being cut into discrete PV modules 2004. During the testing process, one or more areas of the sheet of PV module material 2000 may be identified as being defective. Accordingly, after cutting the sheet of PV module material 2000 into discrete PV modules 2004, previously identified defective sections corresponding to particular discrete PV modules 2004 can be discarded in some embodiments.

Figure 20B:
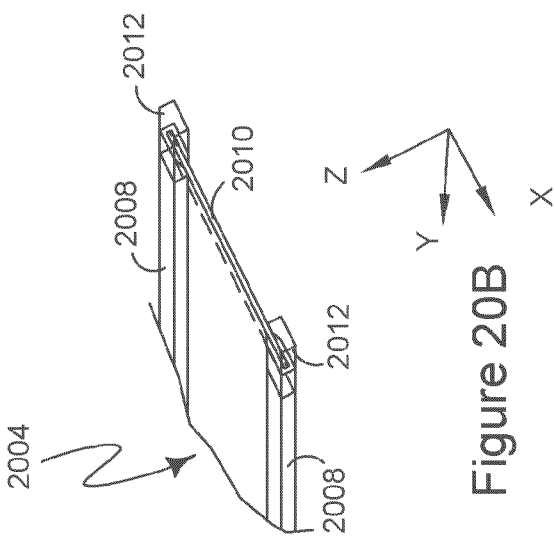
FIGS. 20A and 20B illustrate additional details regarding the formation of PV modules from continuous sheets of PV material.
Figure 20A:
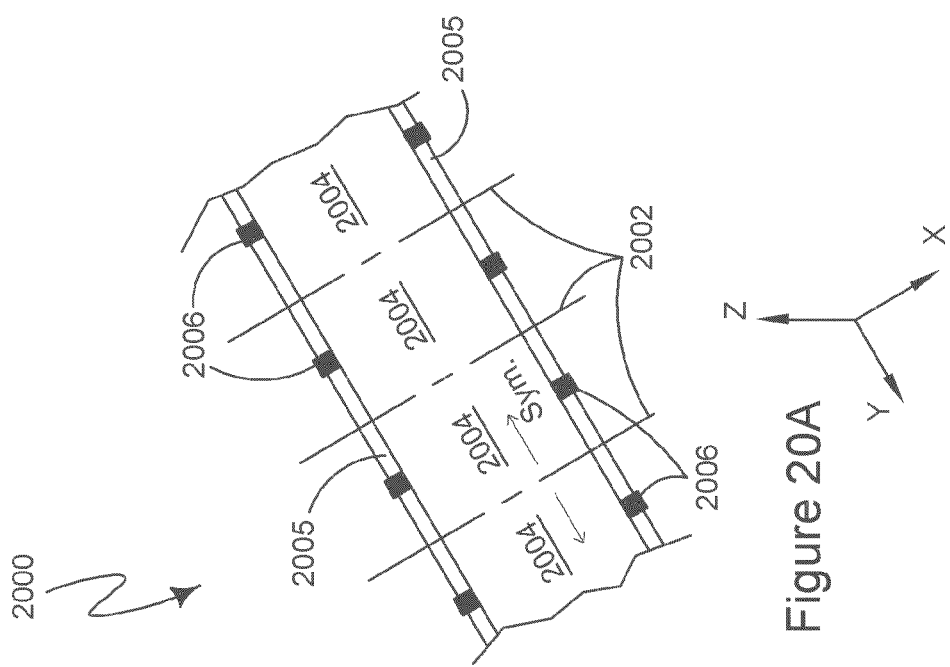

FIG. 20B discloses additional details regarding one of the PV modules 2004. In the example of FIG. 20B, the redundant power conversion circuits 2006 are encapsulated in longitudinal edge caps 2008 before or after the cutting operation described with respect to FIG. 20A. Alternately or additionally, one or more transverse edge caps 2010 are secured to one or both transverse edges of the PV module 2004. Although the PV module 2004 of FIG. 20B is illustrated without concentrators, concentrators can alternately or additionally be formed in the PV module 2004, with the transverse edge caps 2010 being deformable or pre-shaped to match a PV module 2004 with concentrators.

Alternately or additionally, end connectors 2012 are attached at corners of the PV module 2004, the end connectors 2012 being configured to electrically interconnect the PV module 2004 to one or more additional PV modules 2004 and/or a power system. In some embodiments, each of the end connectors 2012 is a junction box ("Jbox"). In these and other examples, the electronic circuit layer 2005 (FIG. 20A) and end connectors 2012 are configured such that current flows in a single direction along each longitudinal edge of the PV module 2004 that has an electronic circuit layer 2005 and power conversion circuits 2006. Optionally, the end connectors 2012 are functionally tested and/or burned in separately from the rest of the PV module 2004 or the sheet of PV module material 2000.

Embodiments of the methods and processes disclosed herein can optionally include shaping interconnecting regions of the PV modules into concentrators. The particular cross-sectional shape of each concentrator is determined in some examples based on a variety of inputs, such as installation angle, direction the installation site faces relative to the four cardinal directions (e.g., North, South, East, West), a latitude of the installation site, and/or elastic and visco-elastic bend relaxation parameters for the PV modules.

In some embodiments, the determination of the shape from the inputs is done by a computing device that executes computer-executable instructions stored on a computer-readable storage medium. When executed by the computing device, such computer-executable instructions cause the computing device to perform a method that includes receiving some or all of the input data described above and determining a shape for a plurality of plastically deformable reflector regions that include the interconnecting regions based on the input data. Alternately or additionally, the computer-executable instructions are configured to cause the computing device to operate a machine that plastically deforms the plastically deformable reflector regions into the determined shape. Further, the determined shape may be described by one or more line segments, parabolic segments, circular segments, elliptical segments, hyperbolic segments, or the like and/or may be piecewise continuous or piecewise non-continuous.

Turning next to FIG. 21A, an example system 2100 is illustrated for testing a sheet of PV module material 2102 that includes a top layer, active layer, bottom layer, electronic circuit layer 2104 along one or both longitudinal edges, and a plurality of redundant power conversion circuits (not shown) attached to the electronic circuit layer 2104 along the length of the sheet of PV module material 2102. In some embodiments, the sheet of PV module material 2102 is in the range of 100 feet to 2000 feet in length, although portions 2102A, 2102B of the sheet of PV module 2102 can be rolled for ease in handling.

As shown, the system 2100 includes a light source 2106, a plurality of rollers 2108A, 2108B and a computing device

2110. The computing device 2110 is connected to the light source 2106 to control operation of the light source 2106. The roller 2108A is electrically connected to one end of the electronic circuit layer 2104 and the roller 2108B is electrically connected to the other end of the electronic circuit layer 2104. Accordingly, the rollers 2108A, 2108B are electrically connected to the power conversion circuits through the electronic circuit layer 2104. In turn, the rollers 2108A, 2108B are connected to the computing device 2110 for making measurements on the sheet of PV module material 2102.

In operation, the computing device 2110 operates the light source 2106 to scan an illumination area 2112 across the sheet of PV module material 2102 and operates the rollers 2108A, 2108B to advance the sheet of PV module material 2104 by turning the rollers 2108A, 2108B as needed. As the illumination area 2112 is scanned across the sheet of PV module material 2102, different areas of the sheet of PV module material 2102 are illuminated, thereby causing these areas to generate power which is ultimately collected by the electronic circuit layer 2104 and processed by the power conversion circuits to generate output power. Boost voltage or other methods are used to compensate the long length of travel required to power the power conversion circuits deep within the length of the sheet of PV module material 2102.

The output power flows though the electronic circuit layer 2104 to one of the rolls 2108A, 2108B and then to computing device 2110 for monitoring and/or analysis. In some examples, and based on the output power received by the computing device 2110, the computing device 2110 measures one or more of the maximum power, resistance, Voc, Jsc, fill factor, and/or other parameters of the corresponding area of the sheet of PV module material 2102 that was illuminated under illumination area 2112. By tracking the parameters as functions of the output power and position of the illumination area 2112 on the sheet of PV module material 2102, defect levels and locations on the sheet of PV module 2102 are identified by the computing device 2110.

For example, FIG. 21B depicts a graph of output power as a function of time, which can be tracked to specific positions of the illumination area 2112 on the sheet of PV module material 2102. The output power includes discontinuities 2114, 2116, 2118 indicative of defects at positions of the sheet of PV module material 2102 corresponding to the times associated with the discontinuities 2114, 2116, 2118.

The measurements made in the system of FIG. 21A in some examples are performed before burn-in testing (described below) and/or after burn-testing. Alternately or additionally, the measurements and/or results of the analysis of the measurements are used for quality control, identifying areas of the sheet of PV module material 2102 to discard, determining the lengths to which the sheet of PV module material 2102 should be cut to form discrete PV modules, expected output for the discrete PV modules, and the like or any combination thereof.

Optionally, the intensity and/or other aspects of the light source 2106 are modulated to assess the response characteristics of the illuminated areas of the sheet of PV module material 2102 under different lighting intensities. Alternately or additionally, the rollers 2108A, 2108B include analog electronics for processing the power output from the electronic circuit layer 2104.

Alternately or additionally, some methods disclosed herein include performing burn-in testing on the sheet of PV module material 2102. In some examples, performing burn-in testing includes electrically activating the sheet of PV module material 2102 through the ends of the electronic circuit layer 2104 and functionally and shunting testing the sheet of PV module material 2102 prior to light exposure. Alternately or additionally, the sheet of PV module material 2102 is exposed to a temperature soak (near maximum temperature soaking) for a period of time (e.g., hours or days), followed by repeat functional and shunting testing with 100% illumination, or greater than 100% illumination if the sheet of PV module material 2102 is rated for use with concentrators. During burn-in testing, defects from the manufacturing process are monitored and limits on changes in performance are set to manage product quality.

The embodiments described herein may include the use of a special purpose or general-purpose computer including various computer hardware or software modules, as discussed in greater detail below.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A photovoltaic module, comprising:
an active layer including a plurality of strips of thin-film photovoltaic material that are arranged spaced apart from and substantially parallel to each other, each of the plurality of strips being continuous substantially the entire length of the photovoltaic module;
a top layer disposed above the active layer, the top layer including a substantially transparent film;
means for serially and redundantly interconnecting the strips of thin-film photovoltaic material together;
a bottom layer disposed below the active layer, the bottom layer including an electrically conductive backsheet electrically connecting a first outer strip of thin-film photovoltaic material and a second outer strip of thin-film photovoltaic material to form a current return path for the strips of thin-film photovoltaic material;
an electronic circuit layer electrically connected between the first outer strip of thin-film photovoltaic material and the electrically conductive backsheet; and
a substantially electrically insulating material disposed between the electrically conductive backsheet and the plurality of strips of thin-film photovoltaic material; wherein:
the electronic circuit layer is electrically connected to a to surface of the first outer strip of thin-film photovoltaic material and the electrically conductive backsheet is electrically connected to a substrate on a bottom surface of the second outer strip of thin-film photovoltaic material; or
the electronic circuit layer is electrically connected to a substrate on a bottom surface of the first outer strip of thin-film photovoltaic material and the electrically conductive backsheet is electrically connected to a top surface of the second outer strip of thin-film photovoltaic material.

2. The photovoltaic module of claim 1, wherein a length of each of the strips of thin-film photovoltaic material is in a range of 20 feet to 40 feet and an aspect ratio of the photovoltaic module is in a range of 6 to 50.

3. The photovoltaic module of claim 1, wherein the substantially transparent film has a thickness in a range of 15 microns to 300 microns, and wherein the substantially transparent film includes a weatherability film and a barrier layer film.

4. The photovoltaic module of claim 1, wherein the means for serially and redundantly interconnecting includes a plurality of top layer conductive strips laminated to a bottom surface of the top layer and interposed between the strips of thin-film photovoltaic material.

5. The photovoltaic module of claim 4, wherein the means for serially and redundantly interconnecting further includes at least one of:
a power collection macro grid intermittently formed on a bottom surface of the top layer, the bottom surface of the top layer being configured to contact an upper surface of each of the strips of thin-film photovoltaic material, wherein each area of the power collection macro grid includes a plurality of interconnected grid lines of conductive material, the plurality of interconnected grid lines of conductive material being between 50 microns to 200 microns wide and 50 microns to 200 microns deep, each area of the power collection macro grid configured to contact and collect power from an underlying strip of thin-film photovoltaic material; or
a power collection nano grid intermittently formed on the bottom surface of the top layer, wherein each area of the power collection nano grid includes a plurality of conductive nano particles arranged in an interconnected network of conductive traces, each area of the power collection nano grid configured to contact and collect power from an underlying strip of thin-film photovoltaic material.

6. The photovoltaic module of claim 5, wherein each of the plurality of top layer conductive strips at least partially overlaps at least one of an adjacent area of the power collection macro or nano grid such that one lengthwise edge of each of the plurality of top layer conductive strips is connected to at least one of an adjacent area of the power collection macro or nano grid.

7. The photovoltaic module of claim 4, wherein the means for serially and redundantly interconnecting further includes a plurality of bottom layer conductive strips laminated to a top surface of the bottom layer, each of the plurality of bottom layer conductive strips being at least partially disposed beneath a corresponding one of the plurality of top layer conductive strips and an adjacent one of the plurality of strips of thin-film photovoltaic material, each strip of thin-film photovoltaic material including a substrate connected to a bottom layer conductive strip and a transparent conducting oxide connected to a top layer conductive strip such that the strips of thin-film photovoltaic material a serially and redundantly interconnected.

8. The photovoltaic module of claim 7, wherein each of the plurality of top layer conductive strips at least partially overlaps an adjacent one of the plurality of strips of thin-film photovoltaic material, a bottom surface of each top layer conductive strip directly contacting the transparent conducting oxide of an adjacent strip of thin-film photovoltaic material.

9. The photovoltaic module of claim 7, wherein the plurality of top and bottom layer conductive strips comprise metal, the photovoltaic module further comprising a visco-elastic material disposed between the plurality of bottom layer conductive strips and the plurality of top layer conductive strips, the plurality of top and bottom layer conductive strips and visco-elastic material forming a constrained layer damper.

10. The photovoltaic module of claim 4, wherein at least one of
the plurality of top layer conductive strips have conductivity ranging from $10^{-6}$ to $10^{-8}$ ohm-meters;
the plurality of top layer conductive strips include at least one of aluminum, stainless steel, copper, tin, or non-stainless low carbon steel;
the plurality of top layer conductive strips include a coating of nickel, aluminum, copper, tin, silver, or strained layers of polyethylene terephthalate; or
each of the plurality of top layer conductive strips is configured to be plastically deformed.

11. The photovoltaic module of claim 1, wherein:
the bottom layer includes a plurality of bottom layer conductive strips laminated to a top surface of the bottom layer;
each bottom layer conductive strip overlaps two corresponding adjacent strips of thin-film photovoltaic material;
an isolation material is disposed between the plurality of bottom layer conductive strips and plurality of strips of thin-film photovoltaic material in areas of overlap;
a first longitudinal edge of each bottom layer conductive strip is connected through at least one contact strip to a substrate on a bottom surface of one of the corresponding adjacent strips of thin-film photovoltaic material in the area of overlap of the first longitudinal edge;

the means for serially and redundantly interconnecting includes a plurality of gimbal strips laminated to a bottom surface of the top layer, each gimbal strip configured to discretely connect a second longitudinal edge of each bottom layer conductive strip to a transparent conducting oxide of the other one of the corresponding adjacent strips of thin-film photovoltaic material.

12. The photovoltaic module of claim 1, wherein:
the top layer includes a plurality of stitched contact strips configured to connect each of a plurality of bottom layer conductive strips to a transparent conducting oxide of an adjacent strip of thin-film photovoltaic material;
each stitched contact strip comprises a wire arranged in a stitch pattern, the wire having a diameter in a range of 12 microns to 75 microns;
each wire comprises at least one of copper, gold, aluminum, or tin; and
each stitched contact strip includes a plurality of contact points, at least some of the contact points configured to contact a bottom layer conductive strip and at least some of the contact points configured to contact the transparent conducting oxide of an adjacent strip of thin-film photovoltaic material.

13. The photovoltaic module of claim 1, wherein the top layer includes a plurality of stitched contact strips, a stitch pattern of each stitched contact strip variably encroaching over an underlying flexible strip of thin-film photovoltaic material along the length of the stitched contact strip.

14. The photovoltaic module of claim 1, wherein:
the bottom layer includes a plurality of bottom layer conductive strips laminated to a top surface of the bottom layer and at least partially aligned between the plurality of strips of thin-film photovoltaic material;
each bottom layer conductive strip overlaps an adjacent strip of thin-film photovoltaic material;
a conductive material is disposed between a top surface of each bottom layer conductive strip and a substrate on a bottom surface of each strip of thin-film photovoltaic material in areas of overlap; and
the conductive material comprises one or more of conductive adhesive, conductive epoxy, or conductive tape.

15. The photovoltaic module of claim 1, wherein the electronic circuit layer includes an input bus, a current return bus and a conditioned output bus, the photovoltaic module further comprising a plurality of redundant power conversion circuits connected to each other in parallel between the input bus, current return bus and the conditioned output bus.

16. The photovoltaic module of claim 1, wherein the electronic circuit layer is fabricated within and during fabrication of the photovoltaic module and wherein the redundant power conversion circuits are housed within discrete housings, the discrete housings within and redundant power conversion circuits being attached to the photovoltaic module after completion of photovoltaic module fabrication.

17. The photovoltaic module of claim 1, wherein the substantially electrically insulating material includes at least one of polyethylene terephthalate or poly methyl methacrylate.

18. The photovoltaic module of claim 1, wherein the conductive backsheet comprises less than three non-metal laminated films and wherein an exposed surface of the conductive backsheet is black and has an emissivity greater than 0.6.

19. The photovoltaic module of claim 1, wherein the conductive backsheet comprises an exposed electrical ground.

20. The photovoltaic module of claim 1, wherein lengths of the plurality of strips of thin-film photovoltaic material are substantially equal, widths of the plurality of strips of thin-film photovoltaic material are different from one strip to another, and the current output of each strip under uniform lighting conditions is substantially equal.

21. The photovoltaic module of claim 1, wherein the bottom layer and top layer extend beyond the edges of the plurality of strips of thin-film photovoltaic material.

* * * * *